United States Patent
Fulford et al.

(10) Patent No.: US 12,114,480 B2
(45) Date of Patent: Oct. 8, 2024

(54) METHOD OF MAKING OF PLURALITY OF 3D VERTICAL LOGIC ELEMENTS INTEGRATED WITH 3D MEMORY

(71) Applicant: Tokyo Electron Limited, Tokyo (JP)

(72) Inventors: H. Jim Fulford, Albany, NY (US); Mark I. Gardner, Albany, NY (US); Partha Mukhopadhyay, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 271 days.

(21) Appl. No.: 17/558,490

(22) Filed: Dec. 21, 2021

(65) Prior Publication Data

US 2023/0200052 A1 Jun. 22, 2023

(51) Int. Cl.
| H01L 21/00 | (2006.01) |
| H01L 29/66 | (2006.01) |
| H01L 29/78 | (2006.01) |
| H10B 12/00 | (2023.01) |

(52) U.S. Cl.
CPC ....... H10B 12/31 (2023.02); H01L 29/66666 (2013.01); H01L 29/7827 (2013.01); H10B 12/033 (2023.02); H10B 12/05 (2023.02)

(58) Field of Classification Search
CPC ...... H10B 12/31; H10B 12/05; H10B 12/033; H01L 29/66666; H01L 29/7827
See application file for complete search history.

(56) References Cited

U.S. PATENT DOCUMENTS

| 7,768,051 | B2* | 8/2010 | Abbott ............... H10B 12/34 |
| | | | 257/302 |
| 9,024,376 | B2 | 5/2015 | Masuoka et al. |
| 9,425,324 | B2 | 8/2016 | Diaz et al. |
| 9,478,624 | B2 | 10/2016 | Colinge et al. |
| 2011/0260225 | A1 | 10/2011 | Lee |
| 2014/0017890 | A1 | 1/2014 | Cohen et al. |
| 2018/0061835 | A1* | 3/2018 | Yang ............... H10B 12/00 |
| 2018/0061837 | A1* | 3/2018 | Mathew ........... H01L 27/0207 |
| 2018/0204833 | A1* | 7/2018 | Cheng ............ H01L 29/78642 |
| 2021/0280582 | A1 | 9/2021 | Lu et al. |
| 2022/0328670 | A1 | 10/2022 | Lee et al. |
| 2023/0088101 | A1 | 3/2023 | Naylor et al. |
| 2023/0099814 | A1 | 3/2023 | Maxey et al. |

OTHER PUBLICATIONS

U.S. Appl. No. 17/524,668 as filed Nov. 11, 2021.
Non-Final Office Action issued for U.S. Appl. No. 17/672,643 dated Aug. 19, 2024 (20 pages).

* cited by examiner

*Primary Examiner* — Richard A Booth
(74) *Attorney, Agent, or Firm* — Foley & Lardner LLP

(57) ABSTRACT

Apparatuses, devices, and methods for fabricating one or more vertically integrated single bit capacitor-based memory cells is disclosed. A single bit capacitor-based memory cell can include a vertically oriented transistor and a vertically oriented capacitor that is vertically integrated with the transistor, so as to form a memory cell. Aspects of the disclosure include process steps for forming the transistor and the capacitor, including a first metal part of a capacitor, a second metal part of a capacitor and an electrically insulating layer disposed between the two. The transistor and the capacitor also include an electrical contact between them and a layer that insulates the transistor from the base layer or the underlying substrate.

20 Claims, 30 Drawing Sheets

| | |
|---|---|
| Base Layer | 104 |
| Dielectric 1 | 106 |
| Metal 1 | 110 |
| Dielectric 2 | 212 |
| SiGe | 218 |
| Doped Si | 214 |
| High-k | 216 |
| Dielectric 3 | 220 |
| Dielectric 4 | 222 |
| Metal 2 | 224 |

CROSS-SECTIONAL VIEW 402

Column 250
Transistor 260
224

TOP VIEW 400

| | | |
|---|---|---|
| ▨ | Base Layer | 104 |
| ▦ | Dielectric 1 | 106 |
| ▩ | Metal 1 | 110 |
| ▨ | Dielectric 2 | 212 |
| ▮ | SiGe | 218 |
| ▨ | Doped Si | 214 |
| ▦ | High-k | 216 |
| ▨ | Dielectric 6 | 232 |
| ≡ | High-k 2 | 228 |
| ■ | Metal 2 | 224 |
| □ | Silicide | 226 |
| ▦ | Metal 3 | 230 |

CROSS-SECTIONAL VIEW 1902

Column 250

TOP VIEW 1900

Etching hole 256

| | | |
|---|---|---|
| ▨ | Base Layer | 104 |
| ▦ | Dielectric 1 | 106 |
| ▨ | Metal 1 | 110 |
| ▨ | Dielectric 2 | 212 |
| ▮ | SiGe | 218 |
| ▨ | Doped Si | 214 |
| ☐ | High-k | 216 |
| ▨ | Dielectric 6 | 232 |
| ▤ | High-k 2 | 228 |
| ▮ | Metal 2 | 224 |
| ☐ | Silicide | 226 |
| ▦ | Metal 3 | 230 |

CROSS-SECTIONAL VIEW 2002

Column 250

TOP VIEW 2000

Etching hole 256

| | Base Layer | 104 |
|---|---|---|
| | Dielectric 1 | 106 |
| | Metal 1 | 110 |
| | Dielectric 2 | 212 |
| | SiGe | 218 |
| | Doped Si | 214 |
| | High-k | 216 |
| | Dielectric 6 | 232 |
| | High-k 2 | 228 |
| | Metal 2 | 224 |
| | Silicide | 226 |
| | Metal 3 | 230 |
| | Dielectric 4 | 222 |

CROSS-SECTIONAL VIEW 2202

224

TOP VIEW 2200

| | | |
|---|---|---|
| ⬚ | Base Layer | 104 |
| ⬚ | Dielectric 1 | 106 |
| ⬚ | Metal 1 | 110 |
| ⬚ | Dielectric 2 | 212 |
| ⬚ | SiGe | 218 |
| ⬚ | Doped Si | 214 |
| ⬚ | High-k | 216 |
| ⬚ | Dielectric 6 | 232 |
| ⬚ | High-k 2 | 228 |
| ⬚ | Metal 2 | 224 |
| ⬚ | Silicide | 226 |
| ⬚ | Metal 3 | 230 |
| ⬚ | Dielectric 4 | 222 |

CROSS-SECTIONAL VIEW 2302

TOP VIEW 2300

| | | |
|---|---|---|
| Base Layer | 104 | |
| Dielectric 1 | 106 | |
| Metal 1 | 110 | |
| Dielectric 2 | 212 | |
| SiGe | 218 | |
| Doped Si | 214 | |
| High-k | 216 | |
| Dielectric 6 | 232 | |
| Dielectric 3 | 220 | |

CROSS-SECTIONAL VIEW 2502

TOP VIEW 2500

| | | |
|---|---|---|
| ▨ | Base Layer | 104 |
| ▦ | Dielectric 1 | 106 |
| ▨ | Metal 1 | 110 |
| ▨ | Dielectric 2 | 212 |
| ▮ | SiGe | 218 |
| ▨ | Doped Si | 214 |
| ▢ | High-k | 216 |
| ▨ | Dielectric 6 | 232 |
| ☰ | High-k 2 | 228 |
| ▮ | Metal 2 | 224 |
| ▢ | Silicide | 226 |
| ▥ | Metal 3 | 230 |
| ▨ | Dielectric 3 | 220 |

CROSS-SECTIONAL VIEW 2602

TOP VIEW 2600

| | Base Layer | 104 |
| | Dielectric 1 | 106 |
| | Dielectric 7 | 234 |
| | Dielectric 2 | 212 |
| | SiGe | 218 |
| | Doped Si | 214 |
| | High-k | 216 |
| | Dielectric 6 | 212 |
| | Dielectric 4 | 222 |
| | High-k 2 | 228 |
| | Metal 3 | 230 |
| | Metal 2 | 224 |
| | Silicide | 226 |

CROSS-SECTIONAL VIEW 2902

TOP VIEW 2900

METHOD OF MAKING OF PLURALITY OF 3D VERTICAL LOGIC ELEMENTS INTEGRATED WITH 3D MEMORY

TECHNICAL FIELD

The present invention relates generally to the field of manufacturing semiconductor devices.

BACKGROUND

In modern semiconductor integrated circuit devices, individual memory circuits play an important role. Manufacturing such circuits usually relies on different fabrication processes, such as film-forming depositions, etch mask creation, patterning, material etching and removal, and doping treatments, many of which are performed repeatedly to form desired circuits on a substrate. Conventional fabrication techniques only manufacture memory circuits in one plane, while wiring or metallization can typically be formed above the active device plane. Devices manufacturing using these techniques are typically characterized as two-dimensional (2D) circuits. Although scaling efforts in 2D circuit fabrication have increased the number of transistors per unit area, 2D fabrication techniques remain limited as they are approaching physical atomic limitations with single digit nanometer semiconductor device fabrication nodes. Semiconductor device fabricators have expressed a desire for new solutions in addressing these challenges.

SUMMARY 3D integration can help alleviate limitations of 2D semiconductor device manufacturing by stacking semiconductor devices not only in the plane of the substrate (e.g., 2D), but also in the third dimension (e.g., the height). Vertically arranging semiconductor devices can open new opportunities for semiconductor device manufacturers as 3D circuit fabrication can substantially increase the number of semiconductor circuits per unit area of a substrate so as to form higher density semiconductor devices.

Typical capacitor-based memory cells, including for example, dynamic random-access memory ("DRAM"), have been implemented using 2D semiconductor techniques. As a DRAM cell typically includes a transistor and a capacitor, this circuit normally is implemented using a trench-based configuration, whereby a transistor is laid out on a substrate next to its corresponding capacitor. However, this 2D arrangement requires a DRAM cell to occupy the substrate surface for both the transistor and the capacitor.

In an attempt to reduce the amount of substrate surface needed to implement a DRAM cell, the present solution can provide a vertically-stacked 3D capacitor-based memory cell design in which a capacitor-based memory cell, such as a DRAM cell, can be implemented on a substrate space that is typically used for only one vertically oriented device, either a capacitor or a transistor, while still implementing the entire DRAM circuit thereon. Specifically, the present solution can provide apparatuses and methods for making 3D vertically stacked capacitor-based memory cells, such as DRAM cells, in which multiple semiconductor devices, such as a transistor and a capacitor, are stacked on top of each other (i.e., oriented vertically with respect to the substrate on which the semiconductor devices are built).

The present solution can implement a vertically integrated DRAM cell by providing a vertical field-effect transistor ("VFET") with an elongate rod-shaped capacitor on top. The VFET can be a vertically-oriented, cylindrical FET. In some implementations, length of the VFET is greater than or equal to its width. In some implementations, the length of the VFET is less than its width. The base of the VFET can have any cross-sectional foot print, such as substantially circular or elliptical, square or triangular, quadrilateral, pentagonal, hexagonal, and so on. The cylindrical VFET can be perpendicular to the substrate and have its source, gate and drain contacts be substantially vertically aligned above one another.

The capacitor of the vertically integrated DRAM cell can also be cylindrically shaped and vertically aligned with the transistor. The capacitor can include two parallel and spaced apart metal components for providing capacitance and acting as capacitor plates. The first metal component can be shaped as a rod having an outer surface that can be inserted into, or formed so as to be at least partly inside of, an elongate interior cavity of the second metal component. A dielectric material layer can be disposed between the outer surface of the first metal rod-shaped component and the interior surface of the interior cavity of the second component into which the first component is formed or inserted. The dielectric material layer can electrically insulate and maintain a distance apart between the first and the second metal components, thereby forming a capacitor with the capacitance occurring between the first metal component and the second metal component. Completing the capacitor circuit, one of the first or the second metal components can be attached to a ground, while the remaining metal component can be attached to the source of power, such as a DRAM refresh signal or a write. The second metal component can then be connected to the source/drain of the transistor, as necessary to complete the DRAM circuit.

The present disclosure can be directed to a memory, such as a memory device. The memory can comprise a first portion including a transistor. The first portion can include a first source/drain structure extending horizontally, a gate structure above the first source/drain structure and extending horizontally and a second source/drain structure above the gate structure and extending horizontally, each of the structures separated from each other by at least one dielectric. The first portion can include a semiconductor material extending from the first source/drain structure to the second source/drain structure. The column can comprise a second portion including a capacitor electrically coupled to and extending from the transistor.

The memory can include a transistor vertical to a plane of a substrate. The transistor can include a first source/drain structure, a gate structure and a second source/drain structure. The memory can also include one or more dielectric materials surrounding the transistor and defining a cavity vertical to the substrate. The cavity can also be defined by any number of same or different materials, including various dielectrics, metals, semiconductors, doped materials and similar. The cavity can include the transistor and extend above the transistor. The memory can also include a semiconductor material disposed in the cavity and in horizontal alignment with each of the first source/drain structure, the gate structure, and the second source/drain structure. The source/drain and gate structures can include metal contacts or lines contacting the doped source/drain regions and/or the gate region. The memory can further include a capacitor disposed in the cavity, vertically aligned with the transistor and an end of the capacitor electrically coupled to the first source/drain structure.

The memory can further include the cavity or a column having a length that is longer than a width of the cavity or the column, and the capacitor and the transistor each vertically aligned with the length of the cavity or column. The memory can include the transistor including a doped silicon material having a length that is longer than a width of the doped silicon material and oriented vertically with respect to the plane of the substrate. The memory can include the transistor including a doped silicon material having a length that is longer than a width of the doped silicon material and extending vertically with respect to a surface of the substrate. In some implementations, the memory can include the capacitor having a length longer than a width of the capacitor and oriented vertically with respect to the plane of the substrate.

The capacitor can include a first metal part having a length longer than a width of the first metal part and forming an interior cavity in the first metal part having a depth longer than an interior diameter of the cavity. The capacitor can also include a second metal part at least partly inserted inside, or formed so as to be at least partly inside, of the interior cavity of the first metal part. The memory can also include a layer of electrically insulating material disposed between the first metal part and the second metal part. A first metal part of the capacitor can be in electrical contact with the transistor and the second metal part of the capacitor can be in electrical contact with the electrical common or the ground.

The present disclosure can be directed to a method of fabricating a memory device including a transistor. The method can include forming a stack of layers for the transistor including a first source/drain structure of the transistor, a gate structure of the transistor, and a second source/drain structure of the transistor. The method can include forming a cavity through the stack of layers. The method can include forming a semiconductor material in a first portion of the cavity, the semiconductor material extending from the first source/drain structure to the second source/drain structure. The method can include forming a capacitor electrically coupled to and extending from the transistor in a second portion of the cavity.

The method can include forming a transistor vertical to a plane of a substrate that includes a first source/drain structure, a gate structure, and a second source/drain structure. A dielectric material surrounding the transistor and defining a cavity vertical to the substrate may be formed, where the cavity includes the transistor and extends above the transistor. A semiconductor material may be formed and disposed in the cavity and in horizontal alignment with each of the first source/drain structure, the gate structure, and the second source/drain structure. The method can include forming a capacitor disposed in the cavity, vertically aligned with the transistor and an end of the capacitor electrically coupled to the first source/drain structure.

The method can further include forming the cavity or the column having a length that is longer than a width of the cavity or the column, and the capacitor and the transistor may each be vertically aligned with the length of the cavity or the column. The transistor may be formed and include a doped silicon material having a length that is longer than a width of the doped silicon material and oriented vertically with respect to the plane of the substrate. The transistor can be extending vertically with respect to a surface of the substrate. The capacitor may be formed and have a length longer than a width of the capacitor and oriented vertically with respect to the plane of the substrate.

The method may further include forming a first metal part of the capacitor to have a length longer than a width of the first metal part. An interior cavity can be formed in the first metal part, the interior cavity having a depth longer than an interior diameter of the interior cavity of the first metal part. A second metal part may be formed and at least partly inserted inside, or formed so as to be at least partly inside, of the interior cavity of the first metal part. A layer of electrically insulating material may be disposed between the first metal part and the second metal part. A first metal part of the capacitor may be in electrical contact with the transistor and forming a second metal part of the capacitor in electrical contact with the electrical common or the ground.

One embodiment of a system can be any system that includes a first dielectric material on a substrate and defining a column that is vertical to the plane of the substrate. The column can be an elongate column, such as an elongate cavity or an etched out hole formed in a material, such as a dielectric material, metal or a substrate. The column can include a transistor oriented along a longitudinal axis of the column and a capacitor. The capacitor can be substantially vertically aligned with the transistor and oriented along the longitudinal axis of the column. The capacitor can have a length that is longer than a width of the capacitor.

The capacitor can include a first metal part of the capacitor adjacent to the first dielectric material and in electrical contact with the transistor, the first metal part oriented along the longitudinal axis of the column and defining an interior cavity. The capacitor can include a second metal part at least partly disposed inside of the interior cavity of the first metal part and in an electrical contact with an electrical common or a ground, the first metal part oriented along the longitudinal axis of the column. The capacitor can include a layer of electrically insulating material disposed between the first metal part and the second metal part.

In some implementations, the system can further comprise a second dielectric material layer that electrically insulates a source/drain of the transistor from the substrate. The system can include a layer of silicide disposed between a doped region of the transistor and the first metal part. The system can include a first metal contact to a first source/drain of a transistor, a second metal contact to a gate of a transistor and a third metal contact to a second source/drain of a transistor. The system can include a first metal contact forming a first source/drain of the transistor, a second metal contact forming a gate of the transistor and a third metal contact forming a second source/drain of the transistor. The system can include an electrical contact between a first source/drain region of the transistor and the first metal part of the capacitor. The system can include the first source/drain region of the transistor being in a closer physical proximity to the first metal part than a second source/drain region of the transistor.

At least one aspect of the present disclosure can be directed to an apparatus, such as a DRAM memory cell. The apparatus can include an elongate column formed in a dielectric material that is disposed on a substrate. The elongate column can include a capacitor that is substantially vertically aligned with a transistor. The capacitor can have a height that is substantially aligned with a height of the column and that is larger than a width of the capacitor. The elongate column can also include a first metal part of the capacitor that is in an electrical contact with an electrical common or a ground and that is at least partly inserted into, or formed so as to be at least partly inside of, a second metal part of the capacitor that is in electrical contact with the transistor. The second metal part can have a height that is oriented substantially along the height of the column. The elongate column can also include a dielectric material layer that is disposed between the first metal part and the second metal part. The elongate column can also include a source of the transistor that is located between a gate of the transistor and the capacitor. The elongate column can further include a drain of the transistor that is located between the substrate and the gate so that the locations of the source, the gate and the drain are substantially aligned along the height of the column.

The apparatus can include the height of the elongate column oriented substantially perpendicular to a plane of the semiconductor substrate and a height of the transistor that is larger than a width of the transistor and that is oriented substantially along the height of the column. The apparatus can comprise the second metal part that is in an electrical contact with the source of the transistor. The apparatus can include a cross-section along the width of the capacitor that is either substantially the same as or substantially vertically aligned with a cross-section along a width of the transistor.

The apparatus can include a height of the first metal component that is greater than a width of the first metal component and the height of the second metal component that is larger than a width of the second metal component. The apparatus can comprise a cross-section along the width of the capacitor that is one of substantially circular or elliptical. The apparatus can include the dielectric material that electrically insulates the first metal part from the second metal part and a second dielectric material layer that electrically insulates the drain of the transistor from the substrate.

The apparatus can include a layer of silicide formed between the transistor and the second metal part of the capacitor. The apparatus can comprise a layer of doped semiconductor material in electrically conductive contact with the source of the transistor and with the second metal part. The apparatus can include the second metal part at least partly inserted into, or formed so as to be at least partly inside of, an interior cavity formed by the layer of doped semiconductor material.

An aspect of the present disclosure can be directed to a method, such as a method for making a semiconductor DRAM cell. The method can include an act of forming an elongate column in a dielectric material disposed on a substrate. The method can also include forming, inside of the elongate column, a capacitor that is substantially vertically aligned with a transistor and that has a height that is substantially aligned with a height of the column and that is larger than a width of the capacitor. The method can also include forming a first metal part of the capacitor that is in an electrical contact with an electrical common or a ground and that is at least partly inserted into, or formed so as to be at least partly inside of, a second metal part of the capacitor that is in electrical contact with the transistor. The method can include forming a height of the second metal part that is oriented substantially along the height of the column. The method can also include forming a dielectric material layer that is disposed between the first metal part and the second metal part. The method can also include forming a source of the transistor that is located between a gate of the transistor and the capacitor. The method can further include forming a drain of the transistor that is located between a substrate and the gate so that the locations of the source, the gate and the drain are substantially aligned along the height of the column.

A height of the elongate column oriented substantially perpendicular to a plane of the semiconductor substrate and forming a height of the transistor that is larger than a width of the transistor and that is oriented substantially along the height of the column. The second metal part may be in electrical contact with the source of the transistor. A cross-section along the width of the capacitor that is either substantially the same as or substantially vertically aligned with a cross-section along a width of the transistor may be formed.

A height of the first metal component may be greater than a width of the first metal component and the height of the second metal component that is larger than a width of the second metal component. The method can also include comprising forming a cross-section along the width of the capacitor that is one of substantially circular or elliptical. The dielectric material may electrically insulate the first metal part from the second metal part and a second dielectric material layer may electrically insulate the drain of the transistor from the substrate. A layer of silicide may be formed between the transistor and the second metal part of the capacitor.

A layer of doped semiconductor material may be in electrically conductive contact with the source of the transistor and with the second metal part. The second metal part may be at least partly formed as or inserted into an interior cavity formed by the layer of doped semiconductor material.

At least one aspect of the present disclosure relates to a system, such as a system that includes a DRAM cell. The system can include a column extending from a substrate. The column can comprise a transistor having a channel extending vertically along the column and a capacitor substantially vertically aligned with the transistor and having a length that is greater than a width of the capacitor. The capacitor can include a first metal part in electrical contact with the transistor and defining an interior cavity. The capacitor can include a second metal part at least partly disposed inside of the interior cavity of the first metal part and in an electrical contact with an electrical common or a ground, the first metal part oriented vertically aligned with the transistor. The capacitor can include a layer of electrically insulating material disposed inside the interior cavity in between the first metal part and the second metal part.

The system can include a second dielectric material layer electrically insulating a source/drain of the transistor from the substrate. The system can include a layer of silicide disposed between a doped region of the transistor and the first metal part. The system can include a first metal contact forming a first source/drain of the transistor, a second metal contact forming a gate of the transistor, and a third metal contact forming a second source/drain of the transistor. The system can include an electrical contact between a first source/drain region of the transistor and the first metal part of the capacitor. The system can include the first source/drain region of the transistor vertically aligned with a second source/drain region of the transistor.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
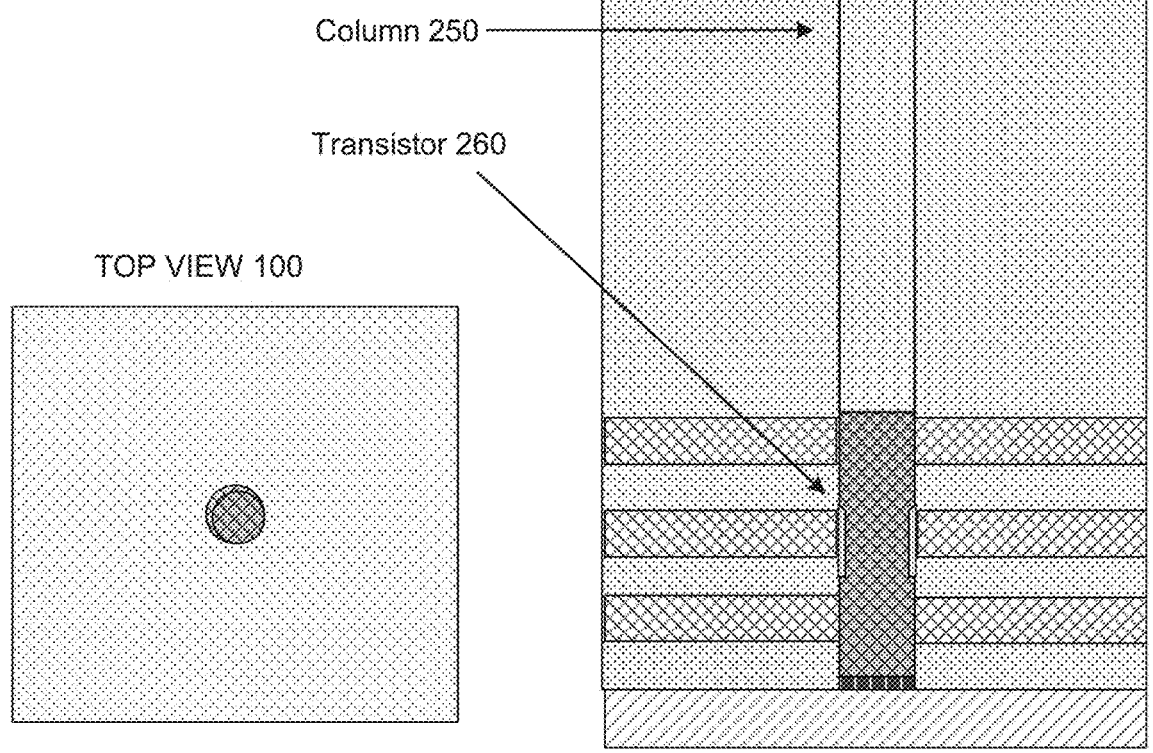
FIGS. 1-7 show top, cross-sectional, and perspective views of an example structure and process flow to form a memory using a hollow core ALD metal/liner approach, according to an embodiment.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

It is understood that apparatuses, systems and devices produced by the structures described herein can be used or find their application in any number of electronic devices utilizing structures and/or circuits described herein, such as for example, controllers, memory chips, systems or process on a chip processors, graphics processing units, central processing units and more. For example, structures and/or circuits described herein can include a part of systems utilizing memory, such as any computing systems including for example: computers, phones, servers, cloud computing devices and more.

The embodiments described herein may enable an increased stack height of one or more 3D semiconductor devices without requiring epitaxial growth (e.g., an epitaxial semiconductor channel or epitaxial source/drain, etc.). Therefore, a semiconductor substrate is not required, and any base layer may be used instead of a traditional substrate. A base layer however can be a semiconductor substrate, such as a silicon substrate. In addition, these techniques can be implemented using self-aligned high-k gate dielectric regions in few process steps, using a metal-first design. As such, these techniques provide both efficient flow and low Dt. In addition, such techniques can enable N-high stacks of semiconductor devices, thereby allowing for higher circuit density. Some embodiments include 3D stacks of vertical conductive channel nano sheets in both CFET and side-by-side configurations.

The process flows described herein utilize conductive dielectric materials to form 3D channel regions for the definition of NMOS and PMOS devices without using epitaxial growth. As such, the techniques described herein can be manufactured, or "stacked" on any existing vertically stacked device or substrate, such as metal, plastic, or otherwise, according to various implementations. The present techniques may improve upon other semiconductor manufacturing techniques by increasing the N height of stacked semiconductor devices, such as transistors, thereby providing high density logic. The techniques described herein provide processes to manufacture high-k gate dielectrics with relatively few process steps using a metal first design. Although illustrations herein may show an NMOS device arranged over a PMOS device, though the configuration may include a PMOS device over NMOS device, NMOS device over NMOS device, PMOS device over PMOS device, or other alternative including one or more NMOS devices or PMOS devices.

The techniques provided herein can utilize conductive dielectric materials (sometimes referred to herein as "conductive channels") or 2D materials, which may have similar properties to semiconductor materials, to fabricate vertical 3D transistors. For example, certain materials, when combined with oxygen, may form new materials that exhibit semiconductor properties (e.g., it can turn "OFF" with low off-state leakage current, or can become highly conductive under certain circumstances, etc.). Some examples of N-type conductive channels include $In_2O_3$, $SnO_2$, InGaZnO, and ZnO. One example of a P-type conductive channel is SnO.

Dielectric materials used herein can be any material or materials having low electrical conductivity, such as for example one millionth of a mho/cm. Dielectric materials can include, for example, silicon dioxide, silicon nitride, nanoporous silica, hydrogensilsesquioxanes (HSQ), Teflon-AF (Polytetrafuoethene or PTFE), Silicon Oxyflouride. Dielectric materials can also include, for example, ceramics, glass, mica, plastics and oxides of various metals.

High-K dielectric can refer to any material with a higher dielectric constant as compared to the silicon dioxide. For example, high-k dielectric can include hafnium silicate, zirconium silicate, hafnium dioxide, zirconium dioxide and others.

As described briefly above, the process flows described herein can utilize such conductive channels to from the 3D channel regions of NMOS and PMOS devices without using epitaxial growth. Accordingly, devices fabricated using these techniques can be stacked on any existing vertically stacked devices, thereby greatly increasing the number of stacked transistors N (e.g., 2, 3, 4, 5, 10, 20, 50, 100, or more) for high-density logic. At least one implementation is directed to a metal-first layer for fabricating transistors with conductive oxide layers. Such techniques can utilize pre-aligned masks to improve etching the central trench to fabricate the devices. Larger trench masks can be used to reduce litho-misalignment issues. Another technique, whereby solid-filled metal layers are formed prior to etching the central trench, may also be used to reduce alignment issues. However, an etching process that is capable of etching through metal can be used.

Further, various techniques may be implemented to form the high-k barrier between the conductive channels and the gate electrode. One such technique utilizes a gate-recessing technique to provide a uniform layer of doped conductive oxide material, along with a selective deposition of a high-k dielectric to form the transistor gates. Another, similar technique provides a non-selective deposition of the high-k dielectric, in conjunction with self-aligned directional etching. These techniques may also be implemented to fabricate stacked transistors of the same type by utilizing the same conductive oxide for two or more transistor layers. These and other aspects are described in further detail herein.

Reference will now be made to the figures, which for the convenience of visualizing the 3D fabrication techniques described herein, illustrate a substrate undergoing a process flow in both top and cross-sectional views. Unless expressly indicated otherwise, each Figure represents one (or a set) of fabrication steps in a process flow for manufacturing the devices described herein. In the top and cross-sectional views of the Figures, connections between conductive layers or materials may be shown. However, it should be understood that these connections between various layers and masks are merely illustrative, and are intended to show a capability for providing such connections, nor should they be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, although most of the figures show various layers in a circular (ring) configuration, other shapes are also contemplated, and indeed the techniques described herein may be implemented in any shape or geometry. In addition, examples in which two transistors or devices are shown stacked on top of one another are shown for illustrative purposes only, and for the purposes of simplicity. Indeed, the techniques described herein may provide for one to nay number N stacked devices. Further, although the devices fabricated using these techniques are shown as transistors, it should be understood that any type of electric electronic device may be manufactured using such techniques, including but not limited to transistors, variable resistors, resistors, and capacitors.

Referring now to FIGS. 1-7, an example of vertically-integrated 3D capacitor-based memory cell is described along with a number of steps used to form the memory cell. At a high level, FIGS. 1-7 are directed to a hollow core ALD metal/liner approach for creating a vertically integrated 3D capacitor-based memory cell, such as for example a DRAM cell. A hollow core ALD metal/liner approach can utilize, for example, a self-aligned scheme for metal deposition without usage of lithography-based techniques.

By combining and stacking a vertical 3D transistor with a vertical 3D capacitor, higher circuit density of capacitor-based memory cells can be achieved. Features by using this approach can include the fact that the bit lines and/or the word lines of individual memory cells can be routed from any angle (i.e., 360 degree extension from a cylinder infrastructure), which can provide added flexibility with various applications and designs. The present solution can include a hollow core metal/liner approach self-aligned configuration and process for adding a capacitor on top of (i.e., in vertical alignment with) a transistor, such as a transistor implemented using steps illustrated in Change(s) applied to document, U.S. patent application Ser. No. 17/524,668 filed on Nov. 11, 2021, titled 3D High Density Compact metal First Approach for Hybrid Transistor Designs without Using Epitaxial Growth, the contents of which are incorporated herein in their entirety. Each of the FIGS. 1-7 generally refer to one or more process steps in a process flow for creating a 3D vertically-integrated DRAM cell. It is understood that the same, similar or different materials that were used for fabrication of a transistor in connection with the above-identified U.S. Patent Application can also be used for the fabrication of a memory cell that utilizes a capacitor integrated with the transistor, such as dielectrics, metals, and/or doped semiconductors. For example, FIGS. 1-7 illustrate a vertical channel structure that utilizes epitaxial silicon instead of conductive oxide or 2D materials, although as will be appreciated by one of ordinary skill in the art, these techniques can be used interchangeably for forming a vertical transistor device. As with the other Figures described herein, for the purposes of simplicity and ease of visualization, some reference numbers may be omitted from some Figures.

Referring to FIG. 1, illustrated are a top view 100 and a cross-sectional view 102 of a structure and steps for fabricating a 3D vertically stacked memory cell. Cross-sectional view 102 shows a cross-section of a cavity or column 250 that can be formed, such as by performing one or more directional etching or coring processes inside of one or more layers of material. The column or cavity 250 may be formed and be vertically oriented with respect to a base layer 104 substrate. The cavity or column 250 can extend from a top surface of the structure to the base layer 104.

A vertically oriented transistor 260, such as a transistor fabricated using steps associated with the above-identified U.S. Patent Application, can be located, formed, and positioned in the cavity or column 250. A vertical capacitor (later also sometimes referred to as a capacitor 270) can be formed and be vertically-aligned with the transistor 260 to form a single-bit DRAM cell. The illustrated example transistor 260 can be either an NPN or a PNP transistor, unless indicated otherwise. Likewise, a source/drain structure of the transistor 260 can be either a source or a drain structure, depending on the configuration. The transistor 260 can be a field effect transistor ("FET") whose length along which a source, gate, and drain structure are formed can be oriented vertically with respect to a surface plane of the base layer 104, such as a silicon substrate. When so oriented, the vertical transistor 260 can sometimes be referred to as a vertical FET ("VFET").

Referring to the cross-sectional view 102 of FIG. 1, the base layer 104 can support thereon the vertical transistor 260. The vertical transistor 260 device can include any device created using steps that are the same or similar to those described in connection with the above-identified co-pending U.S. Patent Application. The vertical transistor 260 can include a layer of Silicon Germanium (SiGe) 218 disposed above and in contact with the base layer 104 with a doped silicon (Si) 214 layer grown thereupon. It is understood that a transistor 260 can also be formed in any number of other doped semiconductor materials. For example, layer of SiGe 218 can include doped germanium, gallium arsenide and/or other doped semiconductors that can be used for forming transistors. In this implementation, layer 218 is epitaxially grown on semiconductor base layer 104 and provides a surface for layer 214 to be epitaxially formed, SiGe 218 layer can have a width that is the width of the transistor 260, and therefore can be surrounded by other materials, such as one or more dielectrics. The source, gate and the drain of the transistor can each be connected to three metal leads 110, illustrated as extending orthogonally to the VFET from either left side, the right side, or both. Each metal 110 can be separated from other metals 110 by a layer of dielectric material 106 that, among others, can provide electrical insulation.

In the example illustrated in FIG. 1, a first layer of dielectric 106 is disposed on top of a base layer 104. The dielectric 106 first layer can adjoin the transistor 260 from all sides. Above the dielectric 106 is a first layer of metal 1 (in the legend shown as metal 110), which can form the source/drain contact at the lower end part of the transistor. The contact can be a source or a drain, depending on whether the transistor is N- or P-type. The first layer of metal 110 can include a contact line for providing power to the source/drain contact, where the contact line can contact the source/drain of the transistor from any of the 360 degree angles around the transistor. On top of the first metal layer of metal 110, a second layer of dielectric 106 can be disposed. As presented in the later Figures, the second layer of dielectric 106 can include the same material, such as the dielectric 106 in this case, or different dielectric materials, as desired, and can adjoin the transistor 260 from all sides. On top of the second dielectric layer 106, a second metal layer, which may form a gate structure or contact, can be disposed. The second metal layer can use metal 110 or other electrically conductive materials, as will be described with respect to some structures later. As with the first metal layer 110, the second metal layer 110 can also include or be in contact with an electrical contact line, which can reach the gate from any of the 360 degree directions. At the gate of the transistor 260, between the doped Si layer 214 that forms the VFET 260 and the second layer of metal 110, is a layer of high-K 216 material. Above the second metal layer 110, a third layer of dielectric 106 can be disposed. As with the prior dielectric layers, the third layer can also include the same or different dielectric as the first and/or second dielectric 106. The third dielectric layer, can also adjoin the transistor 260 from all sides. On top of the third dielectric layer a third metal layer 110 can be disposed and form the other source/drain contact for the transistor 260. As would be understood by a person skilled in the art, whether this contact is a source or a drain can depend on whether the transistor is N or P type. Above the third layer of metal 110 is a fourth layer of dielectric 106 that can be disposed. This layer of dielectric 106, which can include the same or different dielectric materials as those used in the prior dielectric layers, can be substantially thicker than the prior dielectric layers. On top of the fourth dielectric layer, a fifth dielectric layer, of a dielectric 2 (in the legend indicated as 212), can be disposed. Dielectric 212 can be the same or a different than dielectric 106, and just as dielectric 106, the dielectric 212 can include any dielectric used in the industry for semiconductor devices, such as those described herein.

At the step illustrated in FIG. 1, a device mask can be used to complete a directional etch from the top surface of the structure and downward through the dielectric layers 212 and 106. The transistor 260 can be constructed using doped Si layer 214 on a base layer 104. The base layer 104 can be a silicon substrate, or any other substrate for fabricating memory. Transistor can be fabricated by epitaxial growth of SiGe 218 and doped Si 214. The dielectric or other material in the cavity or column 250 above the transistor 260 can be removed by an etching process or any other technique for forming an aligned space in the dielectric layers, such as dielectrics 212 and 106. The etched out space above the transistor 260 in the cavity (when empty) or column (when filled) 250 can be used to form or otherwise fabricate a capacitor.

Figure 2:
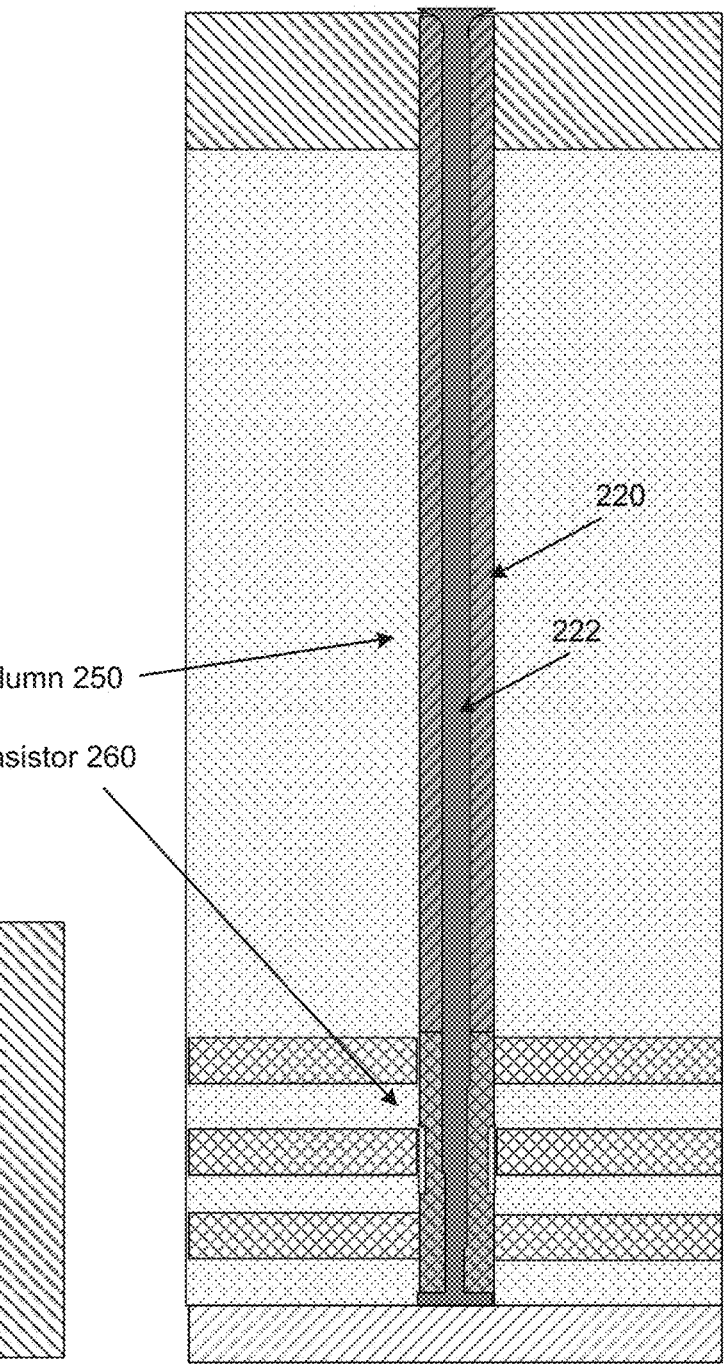
Figure 2:
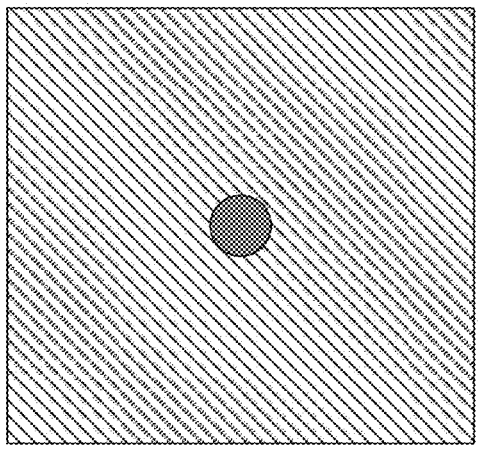

Referring to FIG. 2, illustrated is a top view 200 and a cross-sectional view 202 of the next stage of the process flow in which an ALD process can be used to add a layer of dielectric 3 (identified in the legend as layer 220) at the interior surface of the cavity or column 250. Dielectric 220 can be layered on the inner exposed surfaces of the column 250 above the transistor 260.

After ALD deposition of the dielectric 220, the lining of the dielectric 220 on the walls of the column 250 can serve as a protecting layer, providing a hole through which directional etching can take place downward and through the VFET 260. Because an ALD deposition can produce a layer of material on the sides of the column 250, ALD deposited dielectric 220 can leave an opening that is directed downward through the center of the column 250 that is not covered by the dielectric 220. The vertically aligned opening created by dielectric 220 layer can extend through the column 250 and to the top of the transistor 260. The vertically aligned opening thereby allows for a naturally self-aligned hole through which etching can be implemented directionally downward and through the center of the cross-section of the transistor 260.

Directional etching downward and through the opening the doped silicon 214 of the vertical transistor 260 can be implemented through the vertical length of the doped silicon 214. Directional etching can further be continued through the SiGe 218 (FIG. 1) beneath the transistor 260. The etching step can include any techniques to etch out the SiGe 218 material underneath the transistor 260.

Still referring to FIG. 2, after the SiGe 218 is etched out, a dielectric 4 material (identified in the legend as a dielectric 222), can be deposited through the etched opening defined by the layer of dielectric 220. Dielectric layer 222 can then fill in the entire space that was etched out and/or left empty after etching dielectric layer 220. Accordingly, dielectric 4 222 can fill the interior of the space beneath the transistor 260 and or the base layer 104 that was previously occupied by SiGe 218. Dielectric 222 can also fill the interior of the etched out space in the doped silicon 214. Dielectric 222 can also fill the interior of the space in the column 250 that is above the transistor 260 and that is surrounded by dielectric layer 220. As dielectric 222 can be an electrically insulating dielectric material, depositing the dielectric 222 in the space previously occupied by SiGe 218 can electrically insulate the source/drain at the bottom of the transistor 260 from the base layer 104 to prevent the transistor 260 from shorting to the base layer 104. The dielectric 222 can make the source/drain of the transistor 260 near the base layer 104 electrically insulated from the base layer 104. Once dielectric 222 fills in the gap produced by etching to a top surface of the dielectric 2 222, a CMP process can be done to polish the exposed portions of the dielectric 220 and dielectric 222 on the top surface of the structure.

Figure 3:
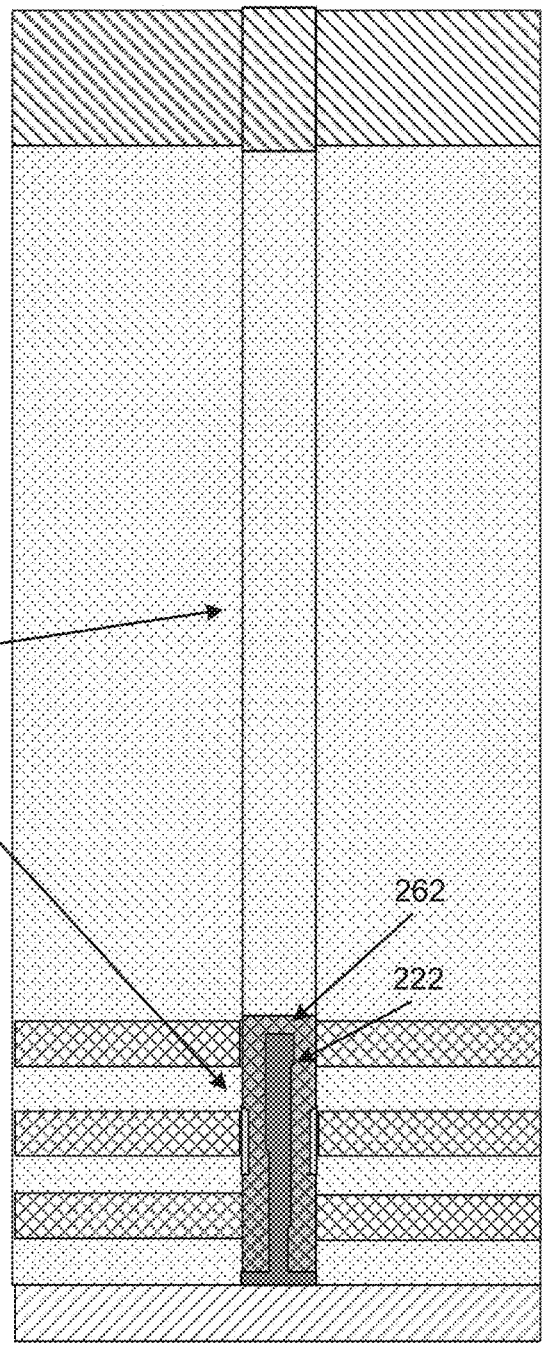
Figure 3:
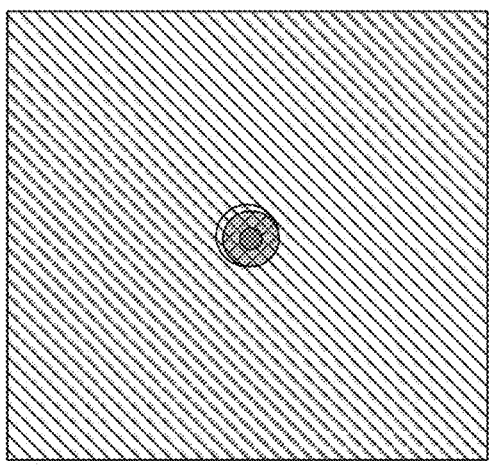

Referring now to FIG. 3, illustrated is a top view 300 and a cross-sectional view 302 of the next stage of the example process flow, in which dielectric layers 220 and 222 can be selectively etched out. While the dielectric layers 220 and 222 can be etched from inside of the cavity or column 250 above the transistor 260, a portion of the dielectric layer 222 that can be left is the dielectric 222 deposited inside of and beneath the transistor 260. Depending on the characteristics of the dielectric 220 and dielectric 222, different methodologies and etching techniques can be used to selectively remove the dielectrics 220 and 222 without removing or otherwise affecting any other materials, including, for example, doped silicon 214, dielectric 106, dielectric 212, metal 110, or base layer 104.

As dielectric 222 is etched out above the transistor 260, the etching may be tailored to leave a slight recess at a region 262 at the top of the transistor 260, where etching takes out a small part of the dielectric 222 towards the top of the transistor 260. This slight recess at region 262 can leave some of the doped silicon 214 exposed. Leaving the doped silicon 214 exposed via the recess at region 262 can facilitate a stronger electrical contact between the source/drain at the top of the transistor 260 and the electrical contact for the capacitor to be fabricated above the transistor 260.

Figure 4:
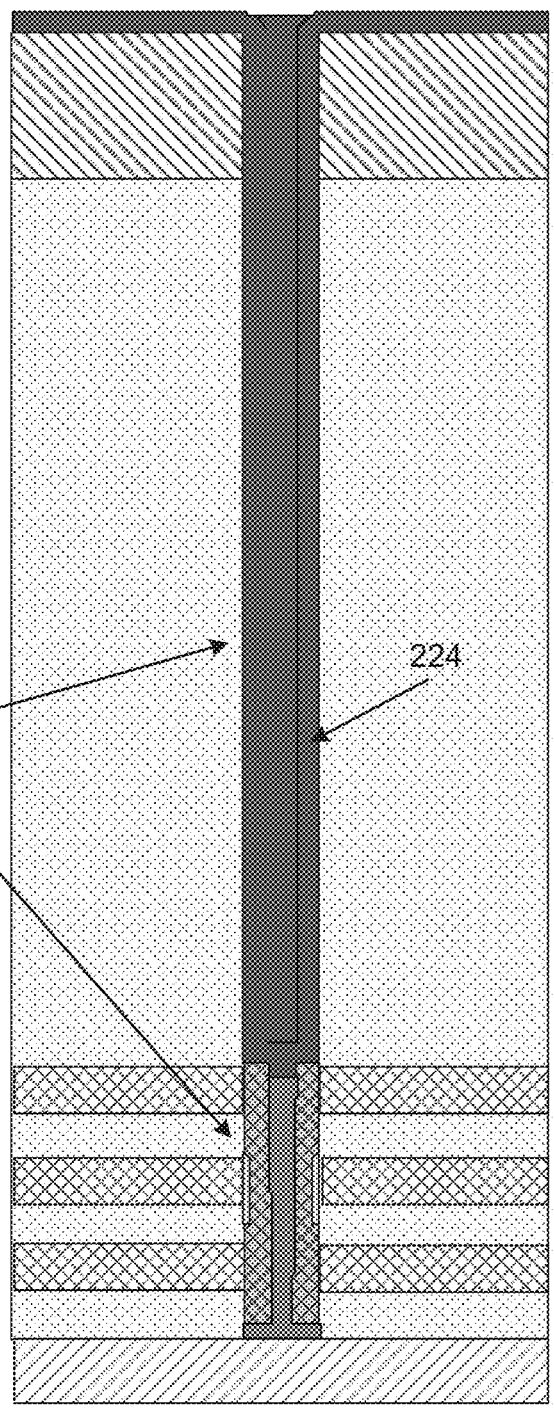
Figure 4:
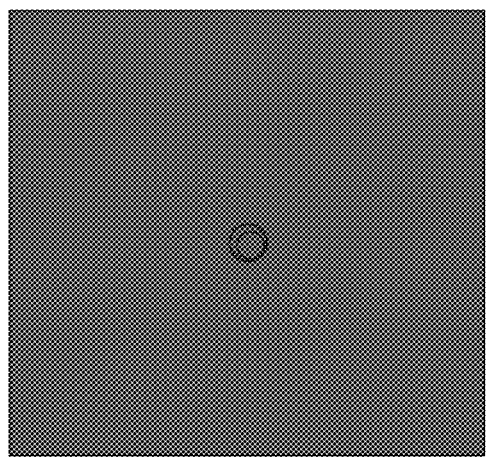

Referring to FIG. 4, illustrated is a top view 400 and a cross-sectional view 402 of the next stage of the process flow, in which the ALD is used to add a layer of metal 2 (shown in the legend as metal 224). Metal 224 can be added via ALD deposition to form a thin film or a layer on the exposed surfaces inside the cavity or column 250 that is left by the preceding etching steps of dielectrics 220 and 222 in connection with FIG. 3. Because a recess was left exposed at or near the top of the transistor 260, ALD deposited metal 224 can form a layer of metal making an electrical contact with the source/drain portion of the transistor 260 towards the top of the transistor 260. The ALD deposition of the metal 224 can line up the interior walls of the column 250 with a layer of metal 224, while leaving the center of the cavity or column 250 unfilled or open. The deposited layer of metal 224 can serve as one of the two pieces of electrically conductive material storing the charge in a capacitor of the DRAM cell.

Figure 5:
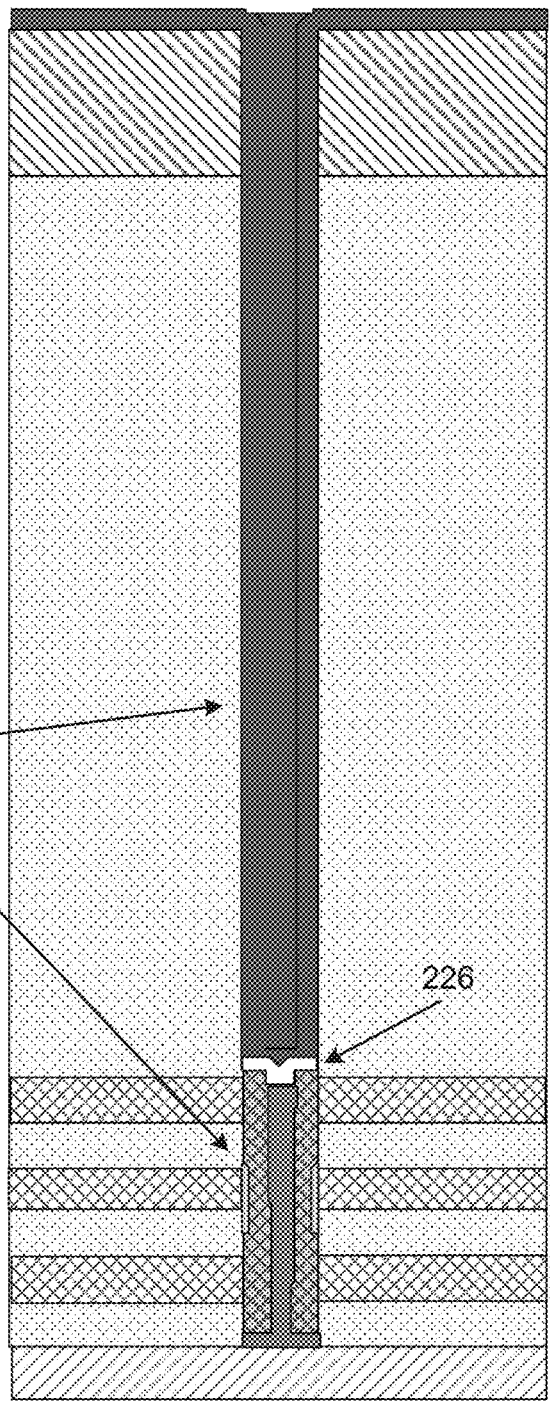
Figure 5:
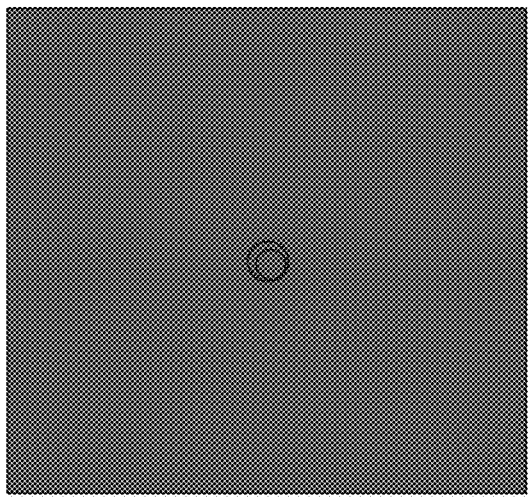

Referring to FIG. 5, illustrated is a top view 500 and a cross-sectional view 502 of the next stage of the example process flow, in which an annealing technique can be used to form a layer of silicide 226 at or near the recess left by steps performed in connection with FIG. 3. Annealing can form the silicide 226 between the doped silicon 214 and the metal 224. Silicide layer between the doped silicon 214 and the metal 224 can form an improved ohmic junction between the source/drain of the material and the metal 224 and improve the performance of the memory cell.

Alternatively, not illustrated here, the silicide 226 can be formed by a two-metal deposition, in which one metal deposition can include a metal, such as a metal 224 or metal 110, that can be used for silicidation, and another metal, such as a metal 224 or metal 110, that is not usable for silicidation. In such instances, silicidation metal layer interfacing with the doped silicon 214 can form the layer of silicide 226. The silicide 226 layer formed by deposition of one or more metals for silicidation can include, for example, nickel silicide or titanium silicide.

Figure 6:
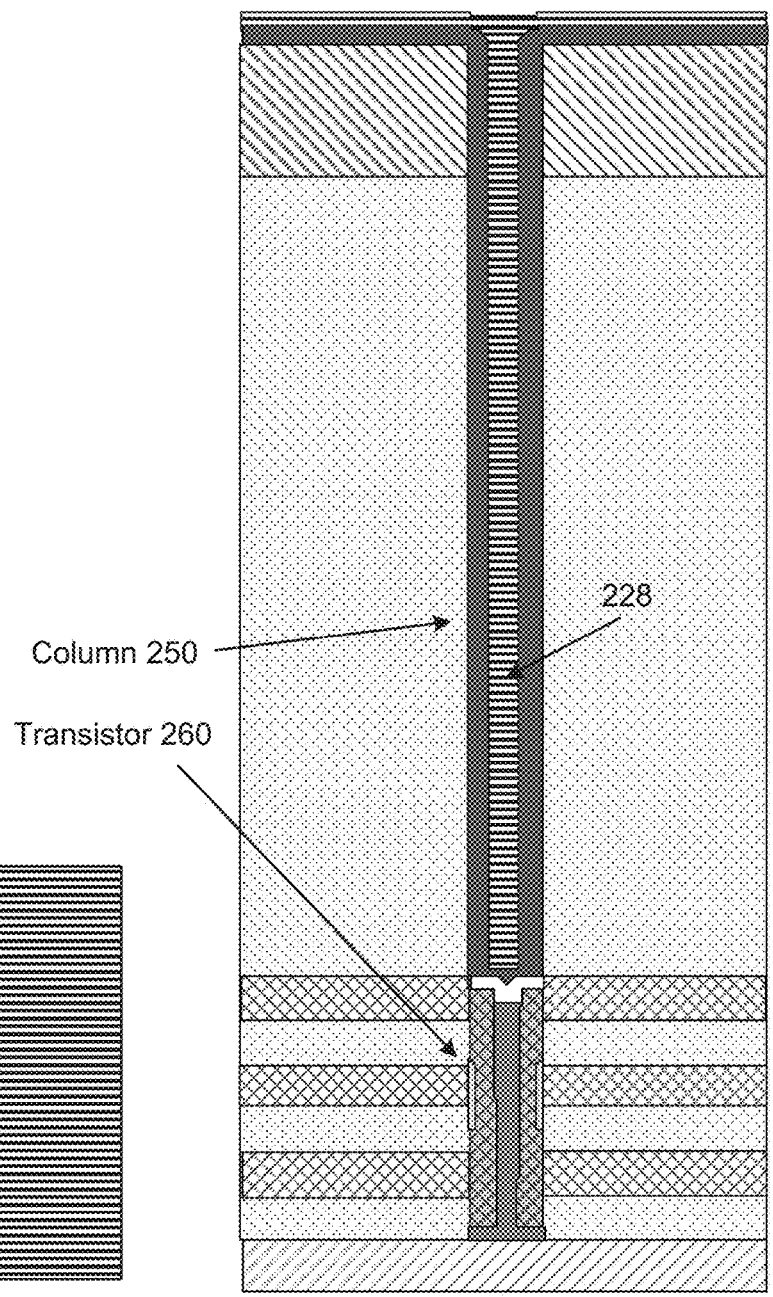
Figure 6:
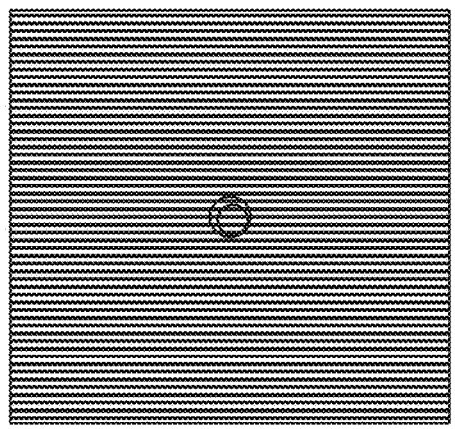

Referring to FIG. 6, illustrated is a top view 600 and a cross-sectional view 602 of the next stage of the example process flow, in which the ALD is used to add a layer of high-k2 material, indicated as 228. High-k2 228 can be the same or different material than high-k 216. High-k2 228 can include electrically insulating materials so as to prevent charge transfer between the two capacitor plates. High-k2 228, depending on the configuration, can include other dielectric materials instead, including, for example, dielectrics 106, 212, 220, and/or 222. High-k2 228 can form a layer of dielectric electrical insulator between the metal 2 224 and the other metal electrode of the capacitor to be added in the next step. The ALD deposition of the high-k2 228 material can provide a layer of high-k2 228 material on top of the layer of metal 224, while leaving the center of the column hollow or open for the next metal deposition.

Figure 7:
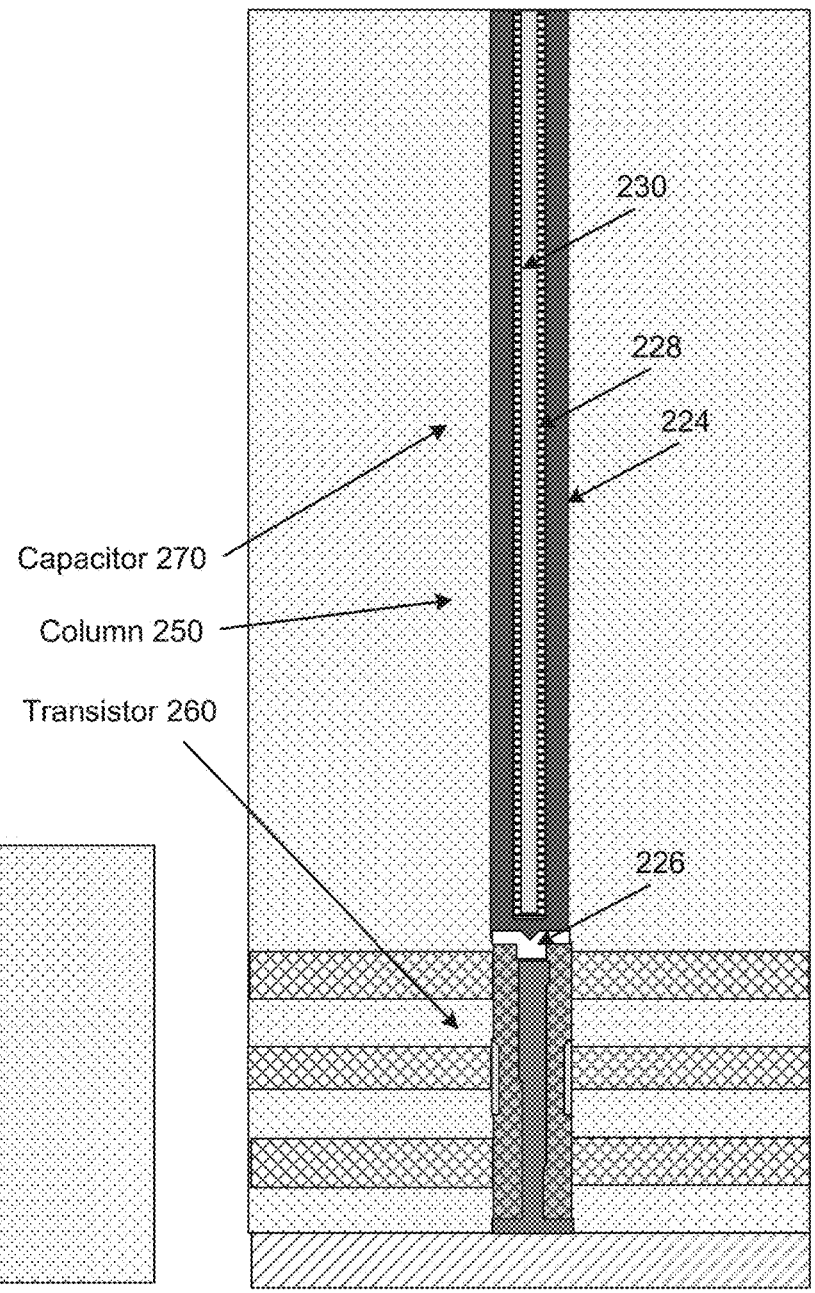

Referring to FIG. 7, illustrated is a top view 700 and a cross-sectional view 702 of the next stage of the process flow, in which the deposition of metal 3, identified as metal 230, can be used fill the remainder of the column 250 within a center column of the high-k2 228. Deposition of metal 230 can be implemented using ALD deposition or any other metal deposition technique. The deposition of metal 230 can fill the center of the column 250, thereby leaving no more open space therein. CMP can be used on the top surface to remove any residual metal 230, high-k2 228 or any other remaining materials, including the entire layer of dielectric 212.

With further regard to FIG. 7, the illustrated structure shows an example of a completed 1-bit memory cell that includes a vertically oriented capacitor 270 vertically aligned and configured with a vertically oriented transistor 260 as part of a vertically oriented cavity or column 250. The capacitor 270 can include the metal 224 outer layer deposited on the outer surface of the cavity or column 250 within which is the deposited thin film layer of the high-k2 228 providing an electrical insulation between the metal 224 and metal 230 the high-k2 228 being extended along the metal 224. The metal 230 deposition can form an elongate and rod-shaped metal 230 that can be disposed inside of the elongate and vertically aligned interior cavity of the metal 224. In some implementations, a dielectric material insulating layer can be used instead of a high-k2 228 layer, such as, for example, a layer of dielectric 106, 212, 220 or 222.

The resulting structure shown in FIG. 7 forms a single-bit memory cell, such as a single-bit DRAM memory cell, that can be formed inside of a vertical cavity or column 250 that includes the transistor 260 and the capacitor 270. The capacitor 270 includes an elongate and vertically oriented metal 224 part that includes an interior cavity that is also elongate and vertically oriented (i.e., aligned along the axis of the vertical transistor 260 and the column 250). The capacitor 270 can also include a second metal part that can be formed by metal 230. The second metal part is an elongate structure that is disposed within the interior cavity of the metal part formed by metal 224. Inside the interior cavity of the metal part formed by metal 224, a layer of high-k2 228 can be disposed to provide electrical insulation between the two metal parts of the capacitor. The transistor 260 can have a drain/source doped Si 214 region, which can be at the top of the VFET and in an electrical contact with the capacitor 270 part formed by metal 224 (e.g., outer column of the capacitor) either directly or via a silicide 226.

Referring now to FIGS. 8-12, an example of a process flow for fabrication of a memory cell using a hollow core metal fill approach is illustrated. The hollow core metal fill approach can implement a same, similar memory cell as the one illustrated in FIG. 7 using a self-aligned process and configuration to etch metal without the usage of lithography. By using a self-aligned process and configuration for etching metal, different fabrication process steps can be implemented to create the same or similar structure to the one illustrated and/or described in connection with FIG. 7.

Figure 8:
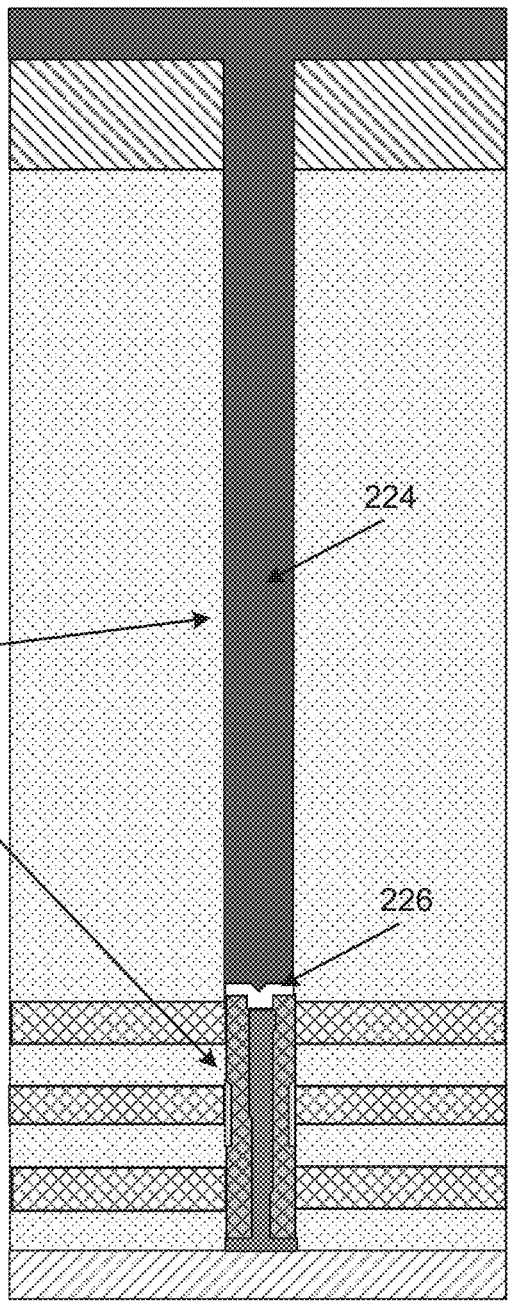
FIGS. 8-12 show top, cross-sectional, and perspective views of an example structure and process flow to form a memory using a hollow core metal fill approach, according to an embodiment.
Figure 8:
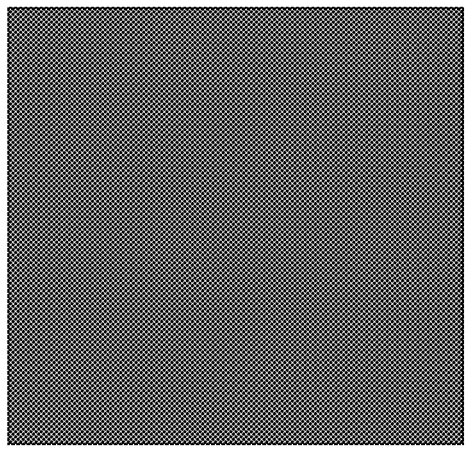

Referring now to FIG. 8, including its top view 800 and its cross-sectional view 2102, an example process flow illustrated in FIGS. 8-12 can begin after the steps of fabrication described and illustrated in connection with FIG. 3 are completed. Particularly, instead of implementing the ALD of metal 2 layer (shown as metal 224 in the legend) as described in connection with FIG. 4, a metal filling of the metal 224 can be done instead. Metal 224 filling process can result in the entire available space in the vertical cavity or column 250 above the transistor 260 being filled with metal 224. As such, the entirety of the cavity 250 that was not filled with other material can be filled with metal 224

Following the metal 224 filling, the structure in FIG. 8 can be annealed in order to form a silicide 226 between doped silicon 214 and the metal 224. As with the example in FIG. 4, metal 224 filling can include two metals, one of which can be a silicidation metal to form the silicide layer. Following these steps, the resulting structure includes the metal 224, which may be a solid metal that fills the column 250 above the transistor 260 and silicide layer 226 between the doped silicon 214 and the metal 224.

Figure 9:
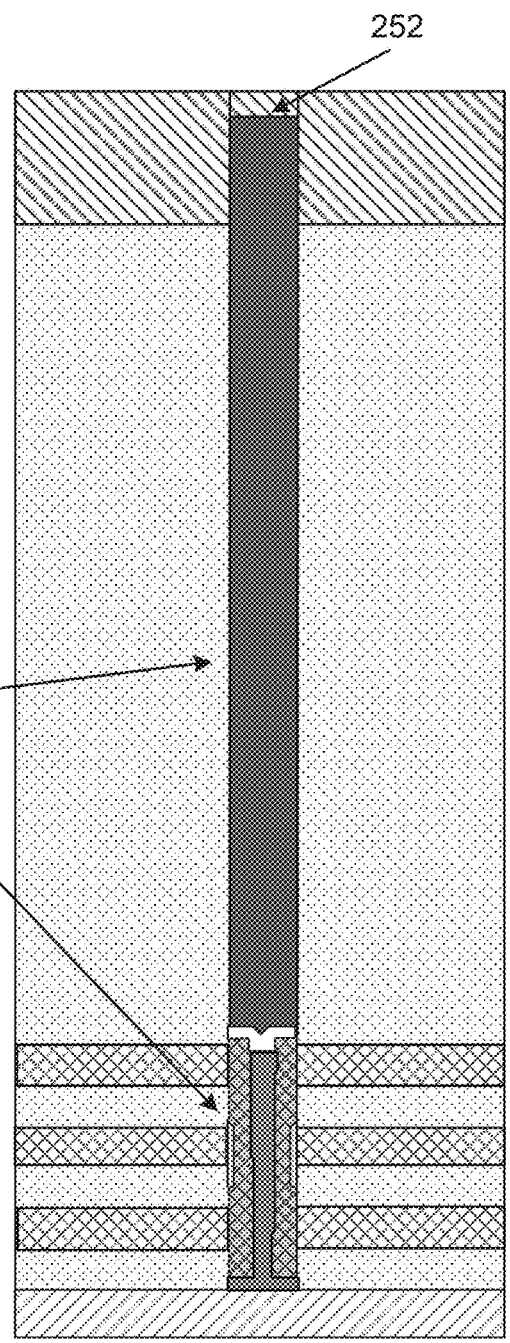
Figure 9:
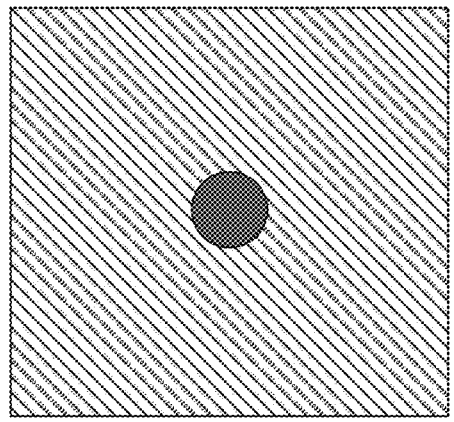

Referring now to FIG. 9, illustrated is a top view 900 and a cross-sectional view 902 of the next stage of the example process flow, a CMP process can be implemented on the top surface in order to remove the surplus of metal 224 on top of dielectric 212. Following the CMP, a top surface of the metal 224 can be briefly isotropically etched to open a small amount of space or recess 252 at the top of the column or cavity 250 to create a height difference between the top surface of dielectric 212 and the top surface of metal 224. Depending on the implementation, different techniques could be used to create the recess 252 of the metal 224 deposition in the cavity 250. The difference in height formed by the recess 252 can be used to create a self-aligned trench for directionally etching metal 224 down the column or cavity 250.

Figure 10:
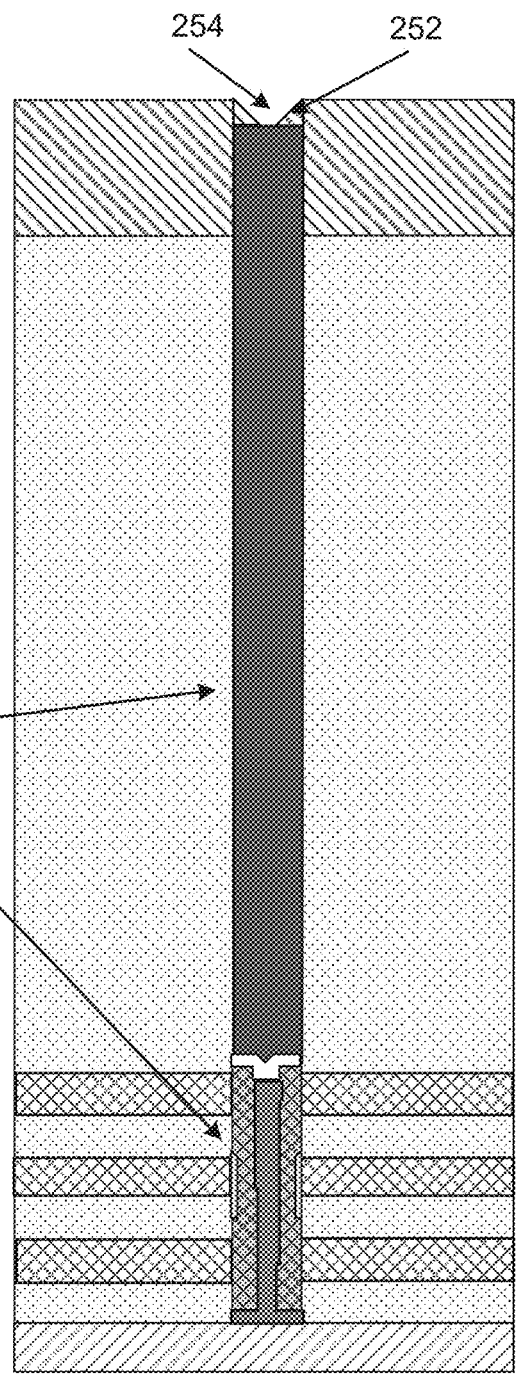
Figure 10:
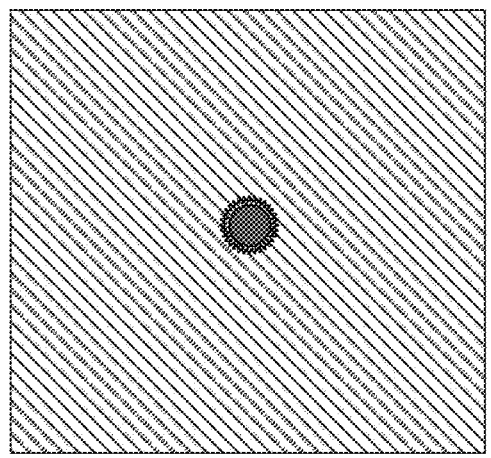

Referring to FIG. 10, illustrated is a top view 1000 and a cross-sectional view 1002 of the next stage of the example process flow, an ALD deposition of a thin dielectric 212 layer can be applied on top of the already present dielectric 212 layer and metal 224. Once a thin layer of dielectric 212 is deposited on top of dielectric 106, a directional etching of the newly deposited dielectric layer 212 can form an opening on top of the recess 252 that was formed in connection with the steps described in FIG. 9. Directional etching through the thin layer of dielectric 212 above the recess 252 can create an opening 254 through the dielectric 212 at the top surface of the metal 224. The opening 254 can have a smaller diameter than the diameter of the cavity or column 250 that is filled with metal 224. The smaller diameter of the opening 254 can be used to directionally etch out a hollow core, or a hollow interior cavity, inside of the metal 224.

Figure 11:
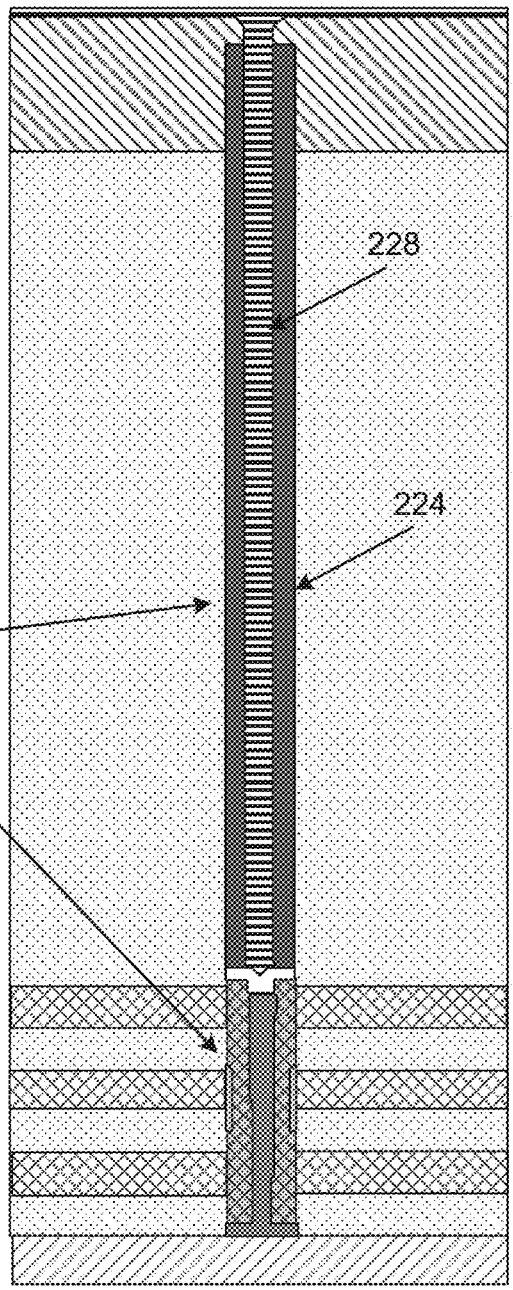
Figure 11:
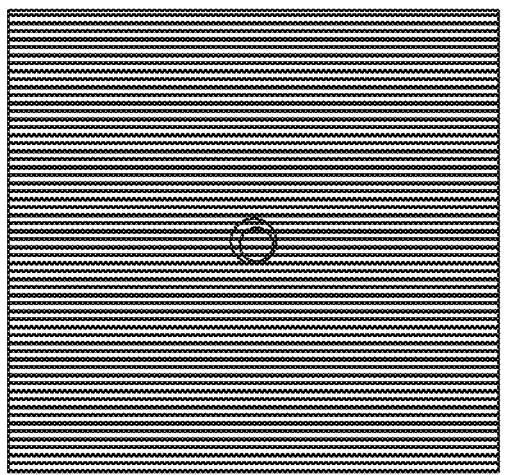

Referring to FIG. 11, illustrated is a top view 1100 and a cross-sectional view 1102 of the next stage of the example process flow. A directional etching of metal 224 down through the hole in the dielectric 212 formed in the steps in connection with FIG. 10 above can be used to etch the metal 224 downward and form a hollow cavity in the metal 224.

For instance, once a directional etch from the top surface and directly down through the opening 254 can etch through the middle of the metal 224 that fills the column 250, the opening 254 in the dielectric 212 top layer can be made so as to substantially align with or at the center of the metal 224 column's top surface. Directional etching of metal 224 can then proceed through the opening 254 until the metal 224 filling inside the cavity 250 is hollowed out.

An ALD deposition of a high-K 2 layer 228 may be disposed on the top surface of the structure and on the interior walls of the column 250 to electrically insulate metal 224 and serve as a liner for the capacitor 270 formed with the metals 224 and 230 later in FIG. 12. High-k2 228 layer can be deposited inside of the interior cavity that is formed by etching the metal 224.

Figure 12:
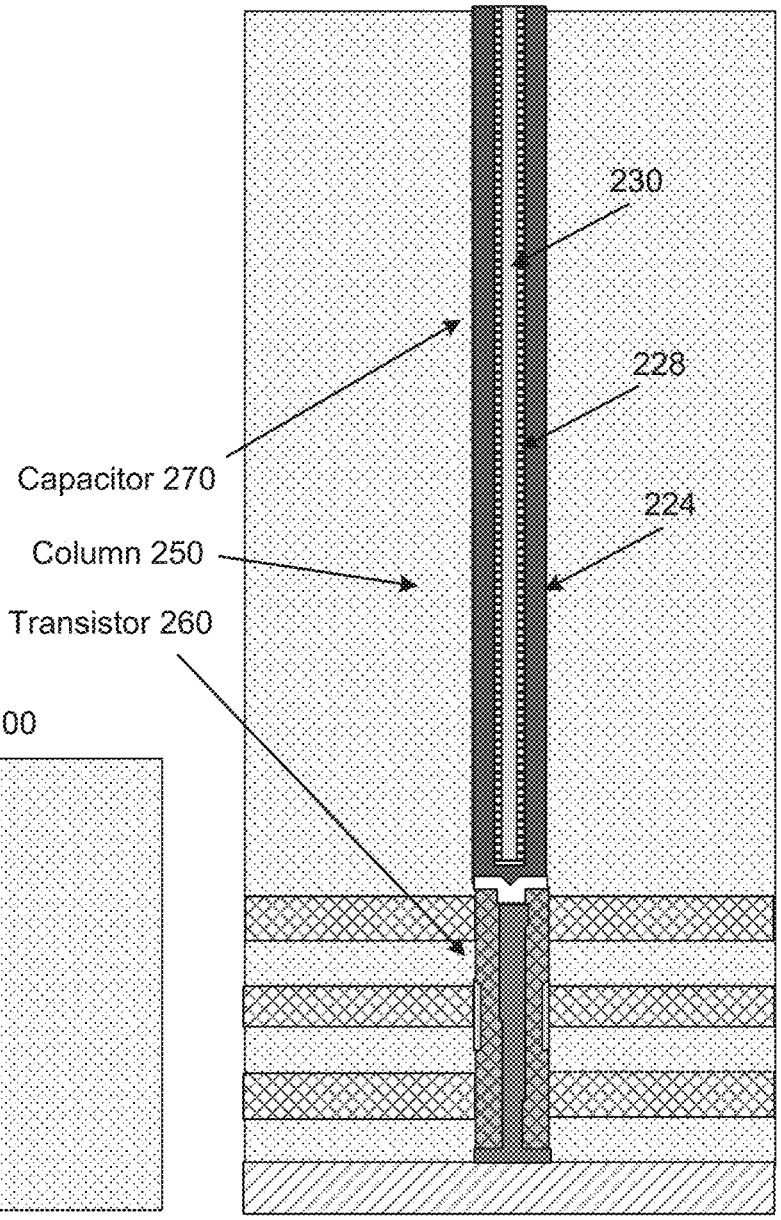

Referring to FIG. 12, illustrated is a top view 1200 and a cross-sectional view 1202 of the next stage of the process flow, in which the deposition of metal 230 can be performed on top of the high-k2 228 layer and used to fill the space inside of the interior cavity of the metal 224. Metal 230 can also fill the remainder of the cavity or column 250. Deposition of metal 230 can be implemented using ALD deposition or any other metal deposition technique. The deposition of metal 230 can fill the center of the cavity or column 250 including remaining gaps in the column or cavity 250. Once this deposition of metal 230 is completed, a CMP can be used on the top surface to remove any residual metal 230, high-k2 228 or any other remaining materials, including the entire layer of dielectric 212.

The structure provided in FIG. 12 can include the same or similar structure as in FIG. 7. The resulting memory cell can include a vertical column or cavity 250 that includes a transistor 260 above which a capacitor 270 is to be stacked. As in FIG. 7, the capacitor 270 of FIG. 12 can include metal 224 outer layer column forming a first metal part of the capacitor 270 and an elongate metal 230 that can be located inside of the interior cavity of metal 224. The metal 224 and metal 230 can be separated from each other by a high-k2 228 layer that keeps the two metal parts from creating a short circuit with each other, thereby maintaining the capacitance. As with the structure from FIG. 7, in some implementations, an electrically insulating dielectric material other than high-k 2 228 can be used for the insulating layer, such as a dielectric 106, 212, 220, and/or 222. The transistor 260 can therefore have a drain/source doped Si 214 region that can be at the top of the VFET and in an electrical contact with the metal 224 (e.g., outer column of the capacitor) either directly or via a silicide 226. The structure in FIG. 12 can therefore be functionally and/or physically the same or similar to the structure in FIG. 7.

Referring now to FIGS. 13-16, an example of a hollow core doped-silicon-metal capacitor approach for creating a vertically integrated 3D capacitor-based memory cell is illustrated. Using this approach, a functionally same or similar structure to the one described in connection with FIGS. 7 and 12 can be implemented, whereby one of the two metal parts acting as the capacitive parallel plates can be used instead of the metal material and include a silicon or any other doped semiconductor can be included.

Figure 13:
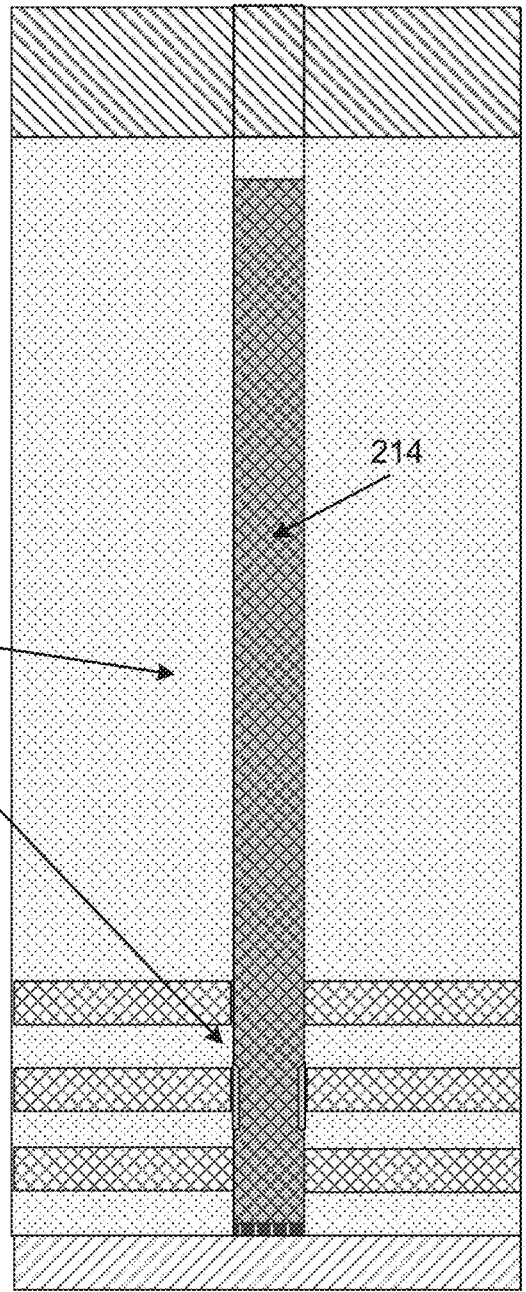
FIGS. 13-16 show top, cross-sectional, and perspective views of an example structure and process flow to form a memory using a hollow core doped-silicon-metal capacitor approach, according to an embodiment.
Figure 13:
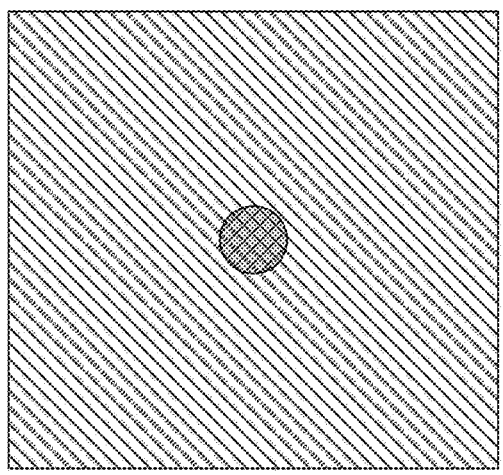

Referring now to FIG. 13, a top view 1300 and a cross-sectional view 1302 of a memory cell is shown. An example process flow illustrated in FIGS. 13-16 can begin by following the process described in connection with a structure illustrated in FIG. 1. From that point, using epitaxial growth of doped silicon 214 can be continued to a point that is close to the top of the surface of dielectric 106 and just beneath the dielectric 212 layer. Doped silicon 214 can therefore be disposed in or otherwise fill most of the column 250. It is understood that instead of the doped silicon 214, depending on the implementation, any other doped semiconductor that can be grown epitaxially in its stead, including any suitable doped materials described herein or known in the art may be utilized.

Figure 14:
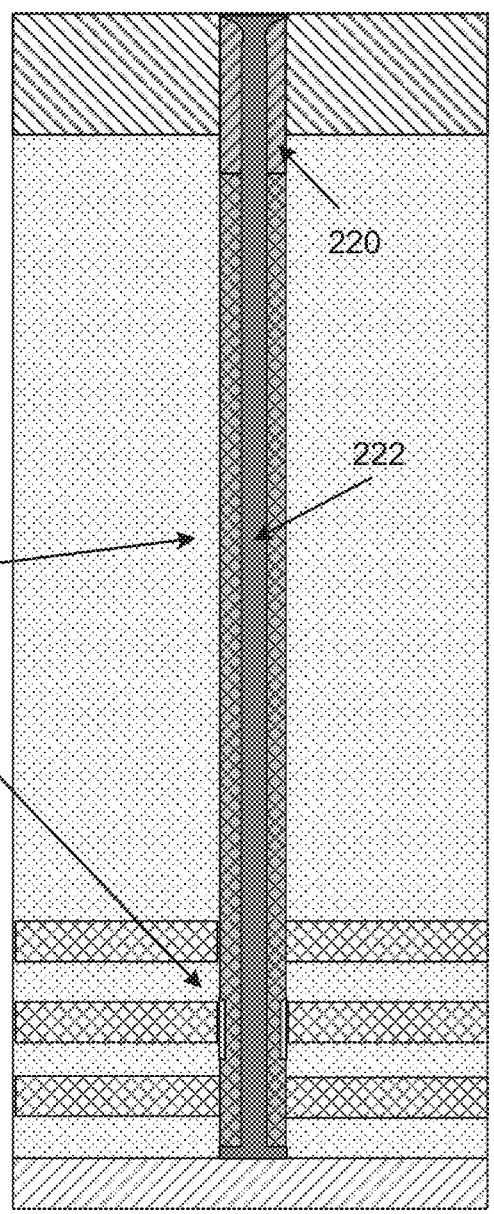
Figure 14:
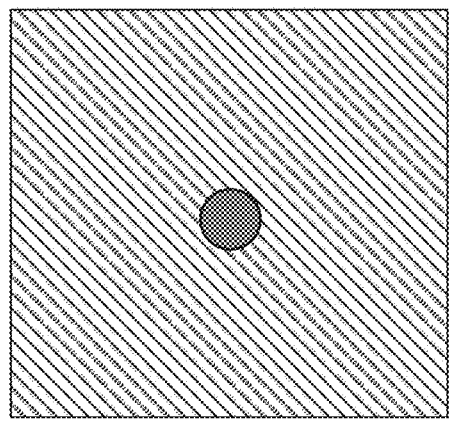

Referring to FIG. 14, illustrated is a top view 1400 and a cross-sectional view 1402 of the next stage of the process flow, an ALD deposition of dielectric 220 can be used to create a liner for a self-aligned hollow core to trench. The ALD deposition can be done at the top of the column 250, above the doped silicon 214 layer. ALD deposition at that location can be implemented in a similar fashion as described in the steps in connection with FIG. 2. As in FIG. 2, a dielectric 220 can form a layer around the interior cavity of the column 250. However, this time the layer is formed further upwards in the column 250, above the doped silicon 214 layer. The thickness of the dielectric 220 can control the diameter of the hollow core to be created through etching.

Because an ALD deposition can produce a liner that leaves an opening or a gap through the middle of the etched column 250, the liner does not fill or seal the column 250. This liner production process can, in turn, allow for a naturally self-aligned hole through the center of the column of cavity 250 from the top of the column 250 to the top of the transistor 260. The self-aligned hole defined by the liner can then be used for directionally etching further down through the center of the transistor 260.

Directional etching through the column of doped silicon 214 via the opening at the top part of the column 250 provided by the ALD deposited layer of dielectric 220 can enable a straight etch through the doped silicon 214 of the transistor 260 and through the SiGe 218 beneath the transistor. Following etching out of the transistor 260, a dielectric 222 can be deposited through the etched out hole in the transistor 260. Dielectric 222 can then fill in the etched out interior of the space that was previously occupied by SiGe 218. As dielectric 222 can be an electrically insulating dielectric material, depositing the dielectric 222 in the space previously occupied by SiGe 218 can electrically insulate the source/drain at the bottom of the transistor 260 from the base layer 104. In addition, dielectric 222 can fill in the interior of the transistor 260 as well as the interior of the entirety of the column 250 above the transistor that was left open by the dielectric 220. At the end, a CMP can be done to polish the exposed portions of the dielectric 220 and dielectric 222.

Figure 15:
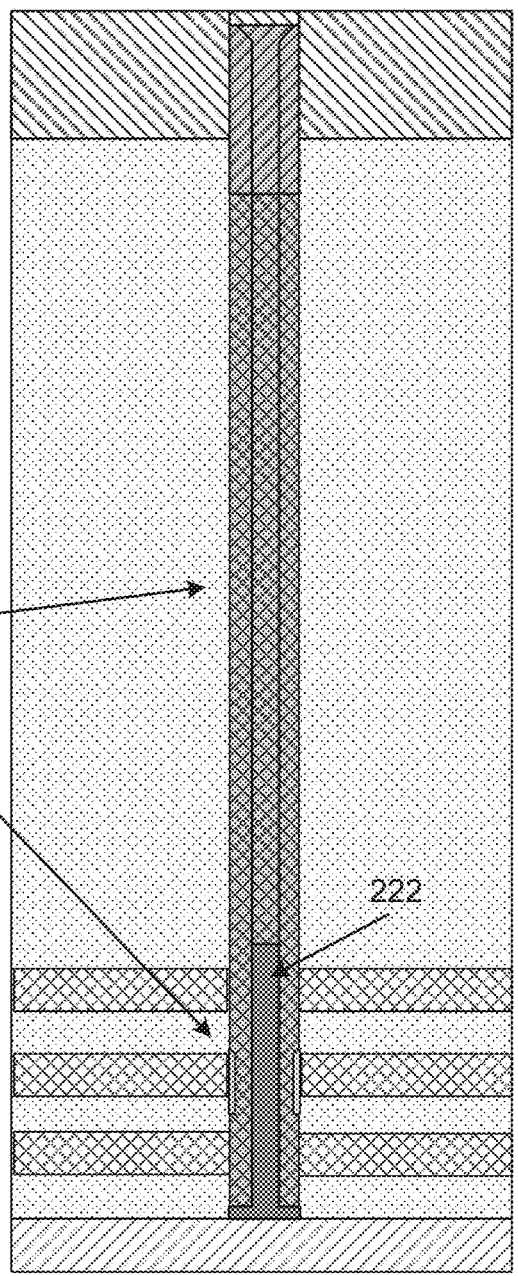
Figure 15:
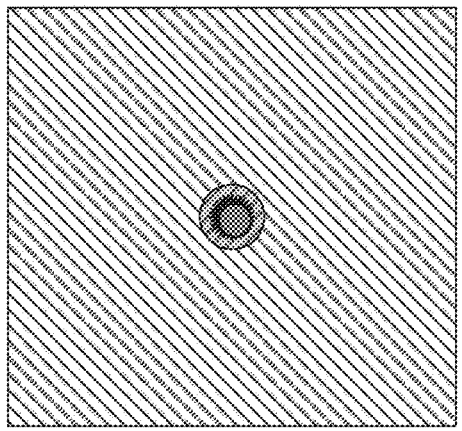

Referring to FIG. 15, illustrated is a top view 1500 and a cross-sectional view 1502 of the next stage of the example process flow, in which dielectric layer 222 is selectively etched out from the interior of the cavity or column 250 above the transistor 260. In an embodiment, the only part of the dielectric 222 that can remain is the dielectric 222 layer that is slightly protruding above the transistor 260, as well as all of the dielectric 222 at and below the transistor 260 (i.e., the dielectric 222 in the transistor 260 and beneath the transistor 260 in the space that used to be occupied by SiGe 218). Depending on the characteristics of the dielectric 222, different methodologies can be used to selectively remove dielectric 222 without removing or affecting any other materials, including doped silicon 214, dielectric 106, dielectric 212, metal 110, dielectric 220, or the base layer 104

Figure 16:
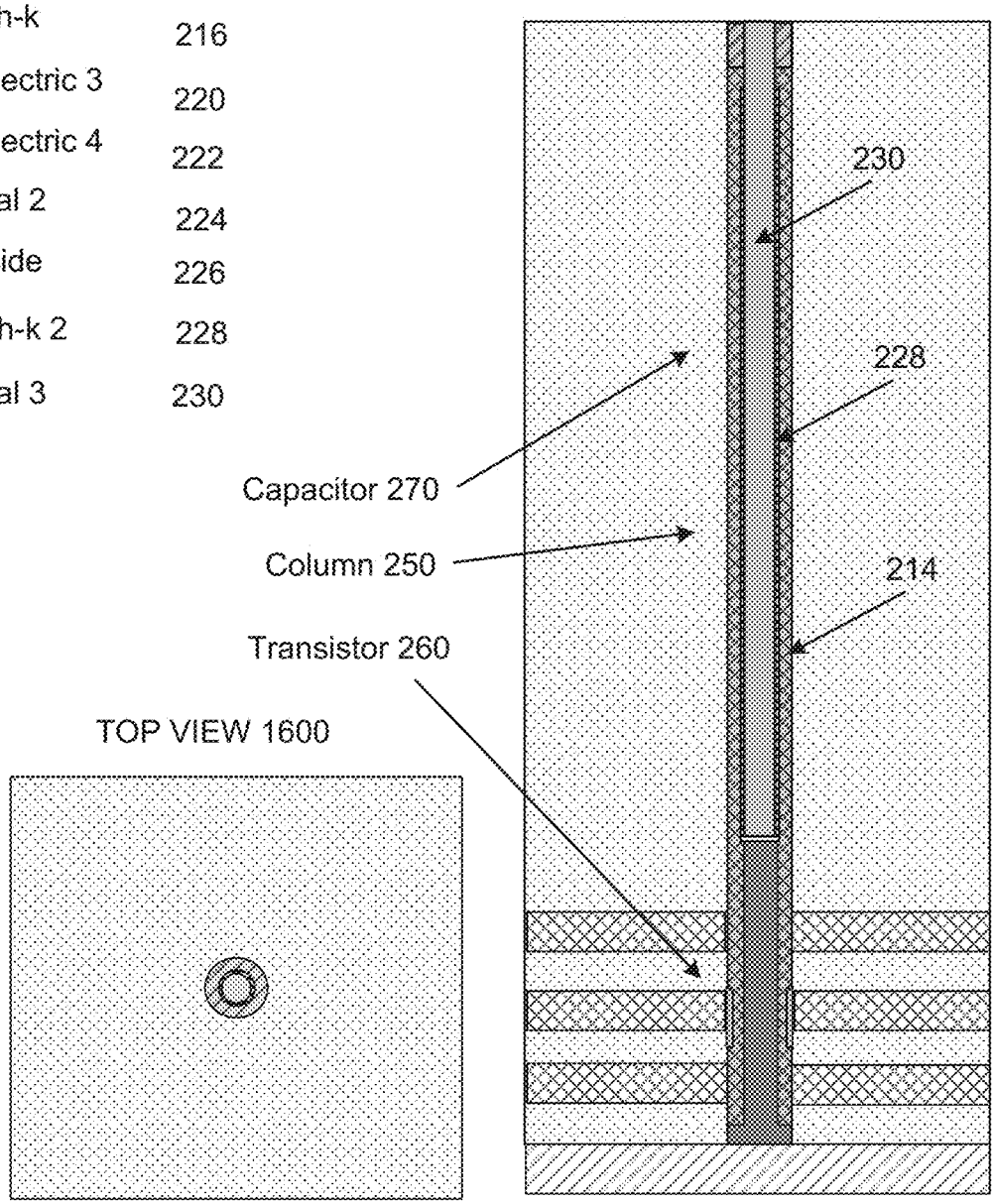

Referring to FIG. 16, illustrated is a top view 1600 and a cross-sectional view 1602 of the next stage of the example process flow in which the construction of the vertical capacitor 270 can be finalized. The process steps in connection with FIG. 16 can include an ALD deposition of high-k2 228 material to form an insulating layer over the exposed doped silicon 214 material left by the etching of dielectric 222. ALD depositing a thin layer of high-k2 228 material can provide an electrically insulating layer between the doped Si 214 and a metal 230 to be deposited on top of the high-k2 228. The process can be completed by a metal deposition of the metal 230 following the ALD deposition of high-k2 228. In some implementations, this process steps completed in this task can include the same or similar steps as described in connection with FIGS. 6 and 16 to deposit the high-k2 228 thin film, followed by a metal 230 deposition. The process steps completed here can also include the same or similar steps as described in connection with FIG. 12. In some implementations the deposition of high-k2 228 material can also be done using a dielectric material, such as dielectric 106, 212, 220, and/or 222. The deposition of the metal 230 can be followed by a CMP to polish the top surface.

Referring now to FIGS. 17-21, an example of a solid core ALD metal/liner approach for creating a vertically integrated 3D capacitor-based memory cell, is illustrated. This approach can create structurally and/or functionally same or similar vertically oriented capacitor-based memory cell as those illustrated in FIGS. 7, 12 and 16 using an ALD metal liner in which the SiGe layer is removed with an etch through an opening or a hole that is separate from the cavity or column 250.

Figure 17:
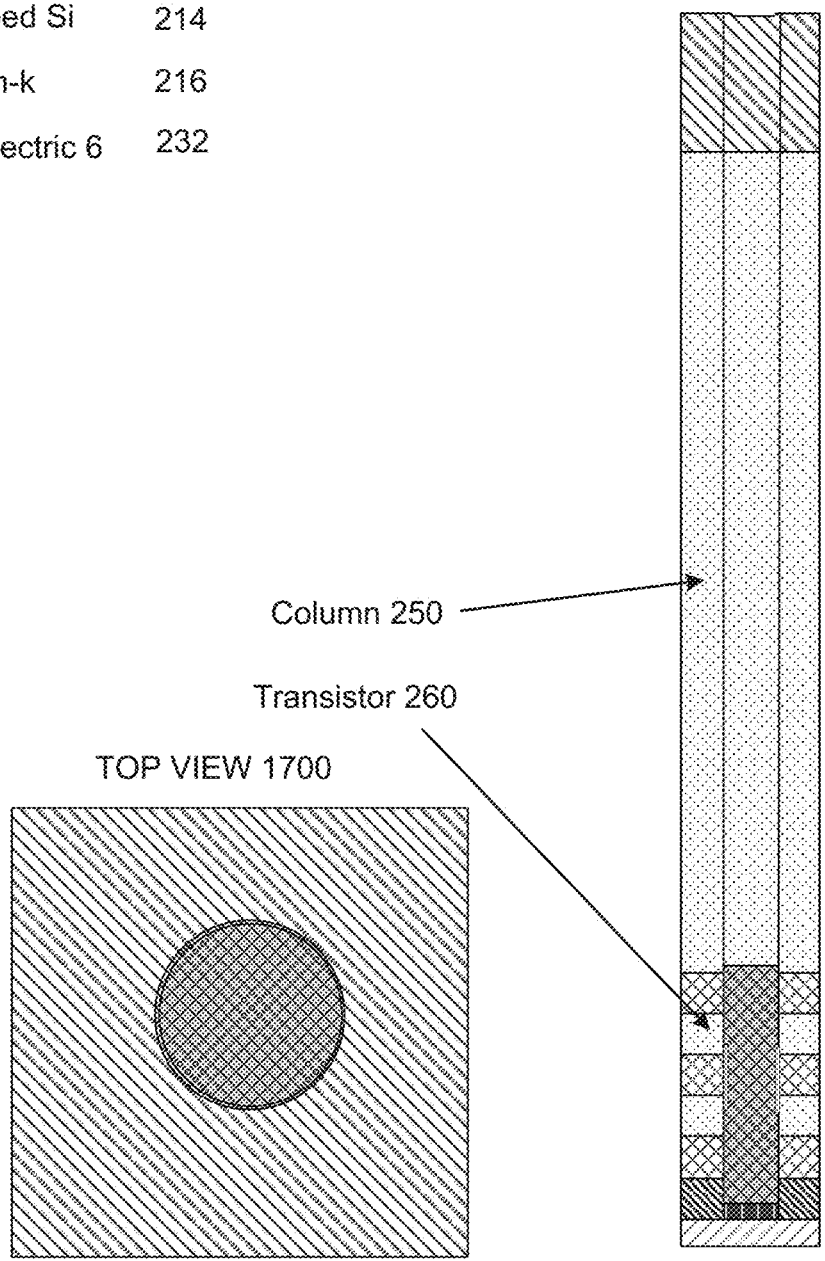
FIGS. 17-21 show top, cross-sectional, and perspective views of an example structure and process flow to form a memory using a solid core ALD metal/liner approach, according to an embodiment.

Referring now to FIG. 17, illustrated is a top view 1700 and a cross-sectional view 1702, an example process flow illustrated in FIGS. 17-21 can begin following the process described in connection with a structure illustrated in FIG. 1. Following the process steps described in FIG. 1, the first layer of dielectric material above a base layer 104 includes a dielectric 232 instead of a dielectric 106 of FIG. 1. The remaining metal and dielectric materials can remain unchanged from those in FIG. 1.

FIG. 17 illustrates a structure in which on top of the dielectric 232 is a first layer of metal 110 that forms the source/drain contact at the source/drain lower end part of the transistor, which can depend on whether the transistor is N or P type. Dielectric 232 may be inserted instead of the dielectric 106 because of one or more properties of the dielectric 232, such as for example being resistant to etching materials used to etch out SiGe 218. The first layer of metal 110 can include a contact line for providing power to the source/drain contact, where the contact line can contact the source/drain of the transistor from any of the 360 degree angles around the transistor. On top of the first metal layer 110 can be a first layer of dielectric 106, which is a second layer of dielectric from the base layer 104. On top of the second dielectric 106 layer a second layer of metal 110 can be disposed contacting the gate of the transistor. As with the first metal layer 110, the second metal layer 110 can also form an electrical contact line, which can reach the gate from any of the 360 degree directions. At the gate of the transistor, between the doped Si layer 214 that can form the vertically oriented transistor 260 and the metal 110 at the gate of the transistor 260 there can be a thin layer of high-K 216 material. Above the second metal layer 110 can be a third layer of dielectric 106, on top of which a third metal layer 110 can sit. The third metal layer 110 can be an electrical contact for the other source/drain contact of the transistor 260. Above the third layer of metal 110 is a fourth layer of dielectric 106 that can be substantially thicker than the prior layers of the dielectric 106. On top of the structure, sitting on the fourth layer of dielectric 106 is a layer of dielectric 212. Dielectric 212 can be the same or a different than dielectric 106, and just like dielectric 106, dielectric 212 can include any dielectric used in the industry for semiconductor devices. The same can hold true for metal layers 110, which can include same or different electrically conductive materials, including different metals, doped semiconductor regions and other electrically conductive materials and structures.

Figure 18:
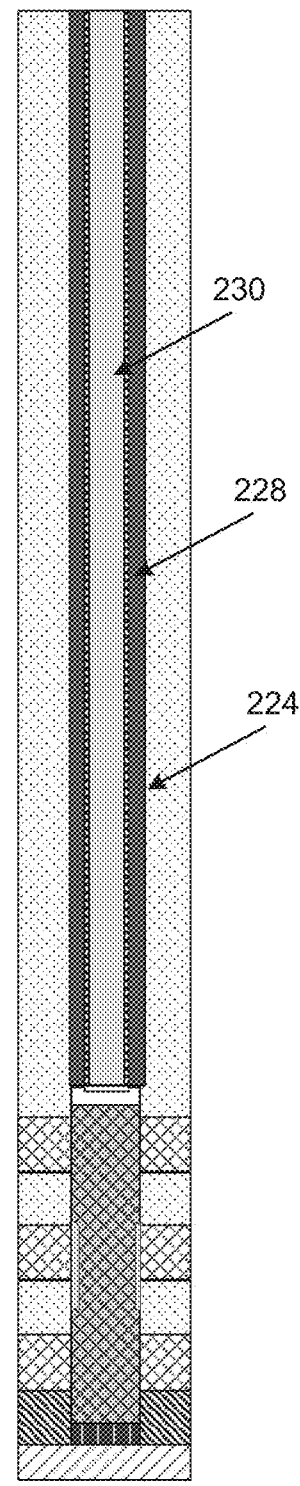
Figure 18:
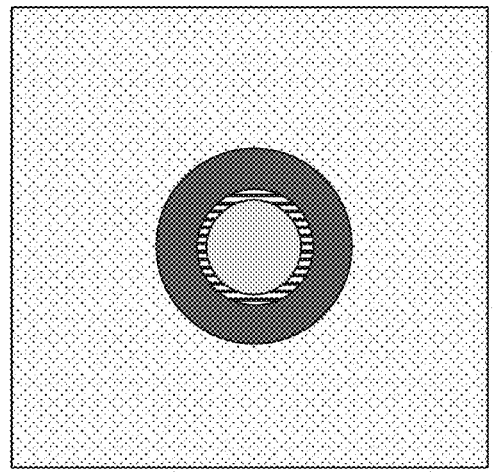

Referring now to FIG. 18, illustrated is a top view 1800 and a cross-sectional view 1802 of the next stage of the example process flow, in which an ALD deposition of metal 224 is completed to form a metal layer on exposed surface of the interior cavity 250. Deposited layer of metal 224 can comprise one of the two metal components of the capacitor 270. Depositing metal 224 can form a metal cavity of the metal 224 component of the capacitor 270. Silicide 226 can be formed either with the metal 224 ALD deposition step using aforementioned techniques with metal depositions, or by annealing.

The process can then include an ALD deposition of high-k2 228 material over the layer of the metal 224 to form an electrically insulating layer between metal 224 and a layer of metal 3 that is to be ALD or fill deposited using metal 230 to fill up the remainder of the gap in the column or cavity 250. In some implementations, silicide 226 can be formed after either the high-k2 228 deposition or after the metal 230 deposition.

Figure 19:
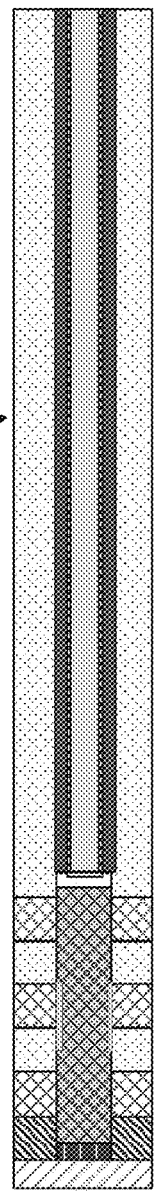
Figure 19:
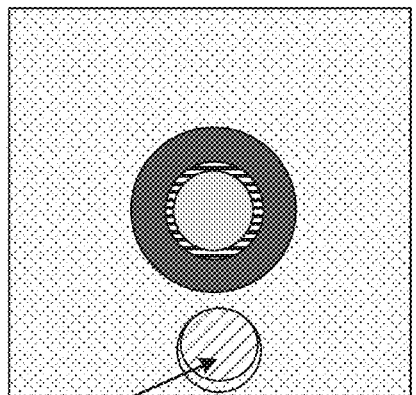
Figure 20:
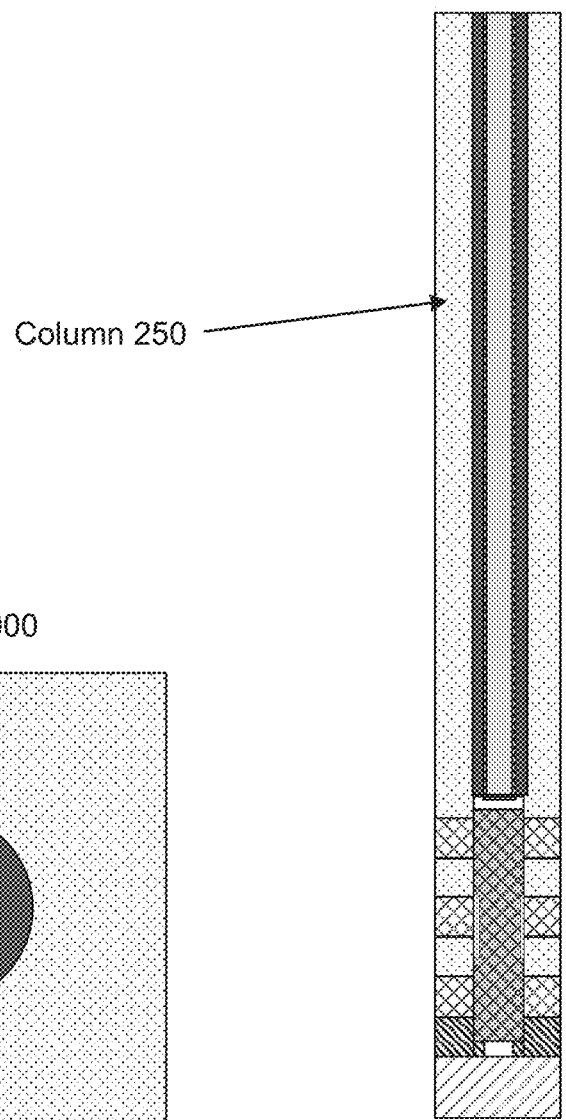
Figure 20:
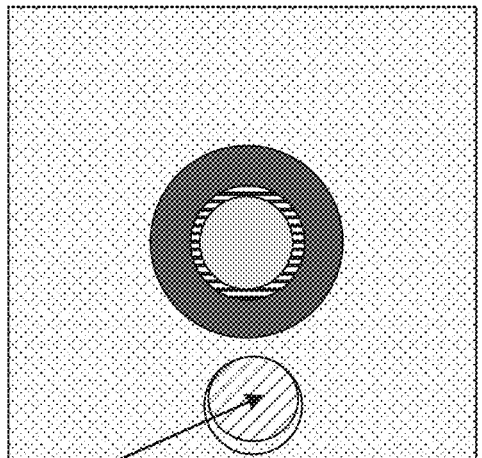
Figure 21:
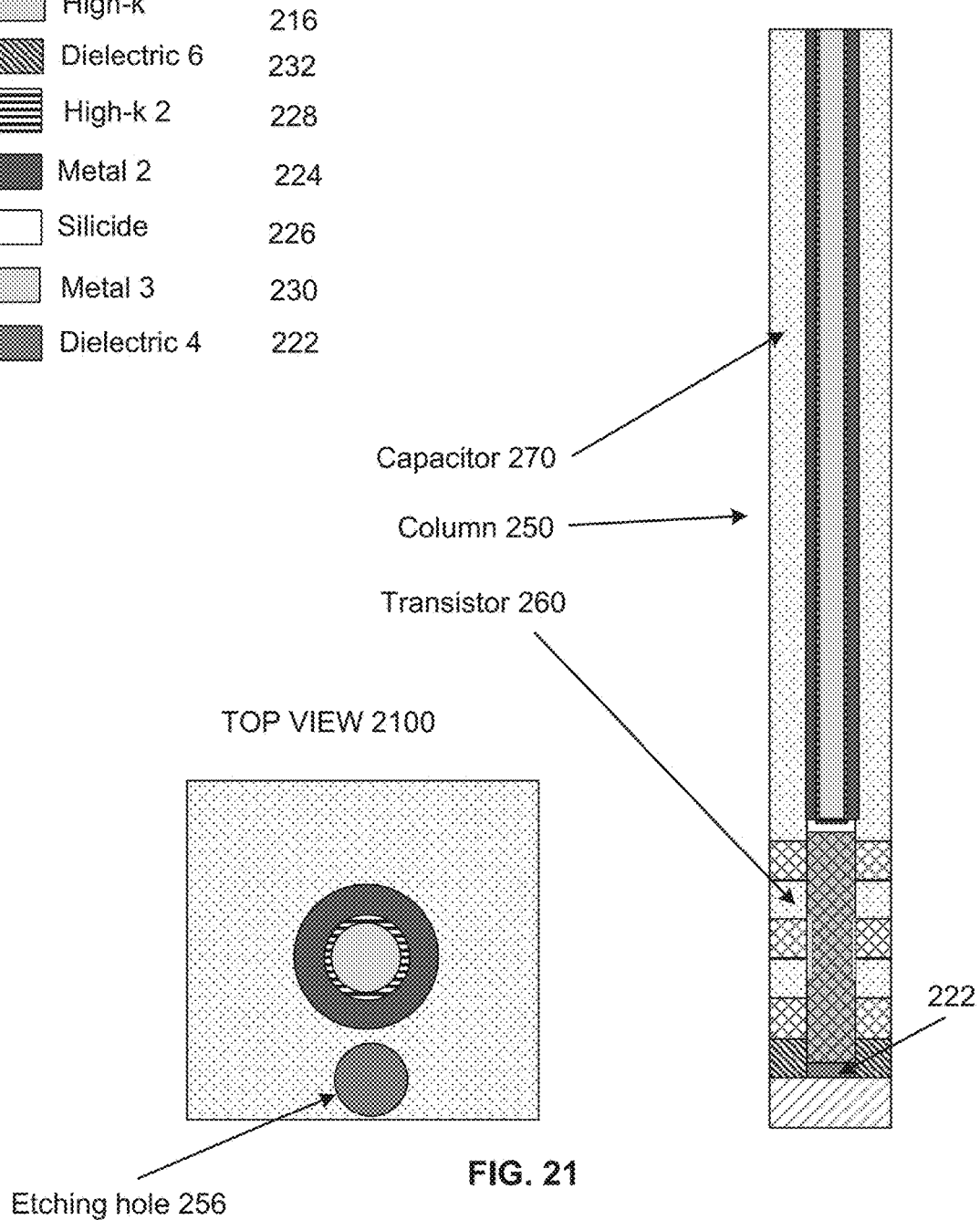

Referring now FIGS. 19-21, illustrated are diagrams for example steps to etch out the SiGe 218 layer underneath the transistor 260. Referring now to FIG. 19, including a top view 1900 and a cross-sectional view 1902 of the next stage of the example process flow, a directional etch can be implemented to the side of the device being built in the column or cavity 250. The directional etching towards the SiGe 218 can be done through etching hole 256. The directional etching can be implemented directionally and without any selectivity downward to reach the SiGe 218 location. Lithography techniques can be used and a SiGe 218 etching mask can be used to complete the etching of the side of the device inside a column/cavity 250.

As shown in FIG. 20, including its top-view 2000 and cross-sectional view 2002, etching can be implemented through the etching hole 256 using SiGe 218 etching mask to etch the side of the device directionally towards the SiGe 218 layer. Once the SiGe 218 layer is reached, the entire SiGe 218 layer can be removed by etching SiGe isotropically, thereby leaving only a base layer 104.

As shown in FIG. 21, including its top-view 2100 and cross-sectional view 2102, a deposit fill using dielectric 222 material can be used to fill in the etching hole 256 left by the directional etch of the SiGe 218. Filling in the location where SiGe 218 used to be with dielectric 222 can electrically insulate the source/drain transistor region of the transistor 260 at the lower end of the cavity/column 250.

Figure 22:
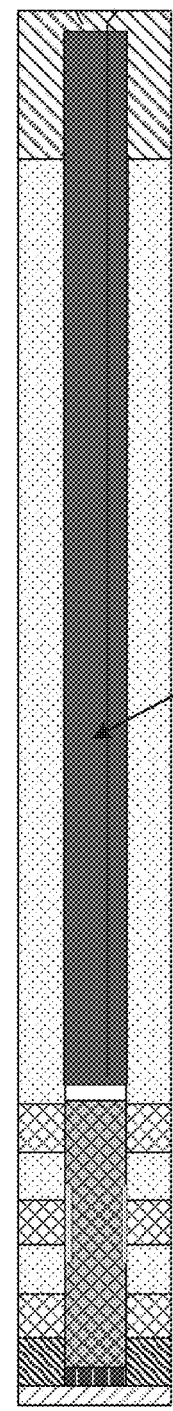
FIGS. 22-24 show top, cross-sectional, and perspective views of an example structure and process flow to form a memory using a solid core metal fill approach, according to an embodiment.
Figure 22:
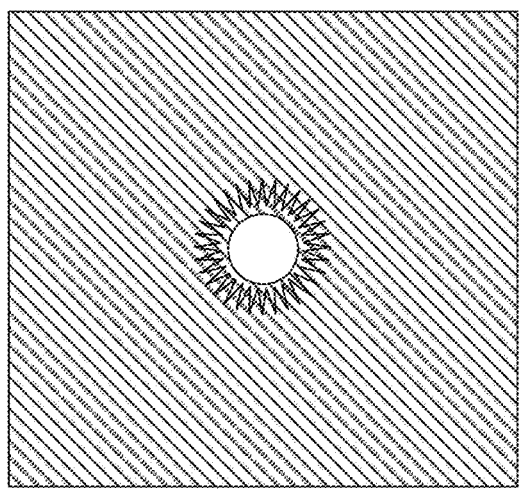
Figure 23:
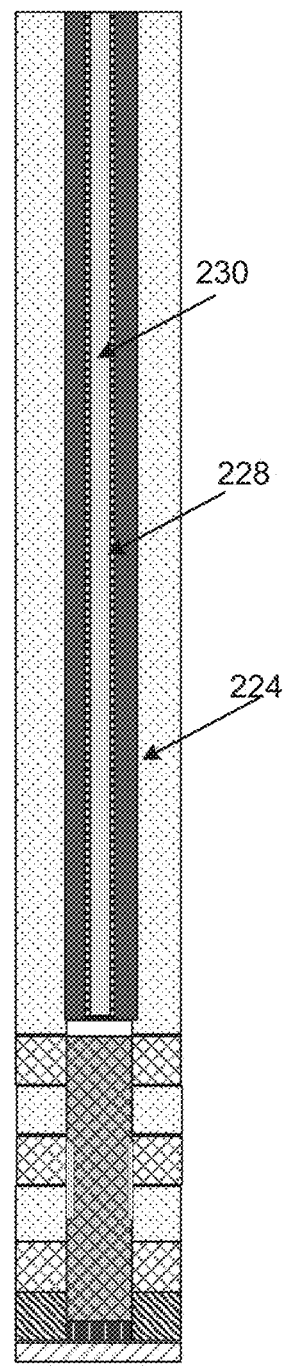
Figure 23:
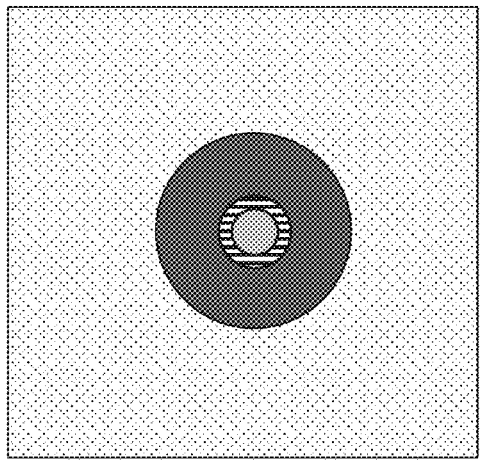
Figure 24:
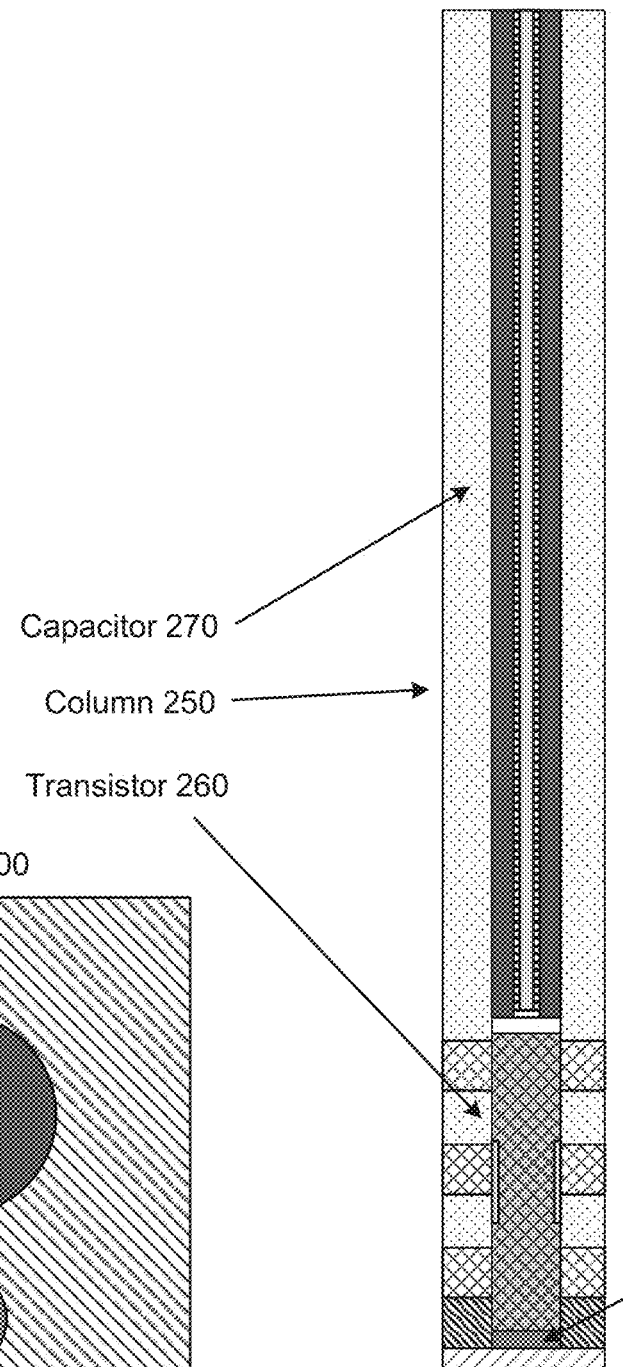
Figure 24:
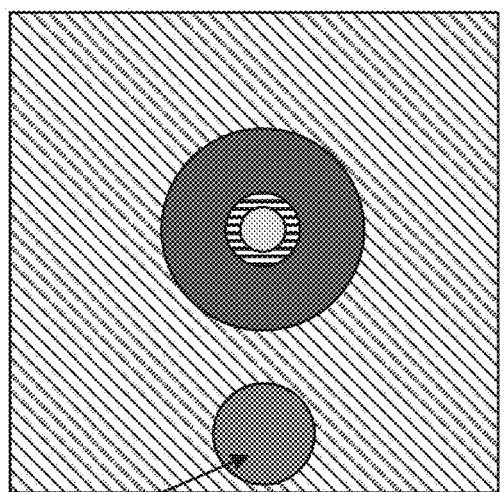

Referring now to FIGS. 22-24, an example of a solid core metal fill approach for creating a vertically integrated 3D capacitor-based memory cell, is illustrated. This approach can include a self-aligned scheme to etch metal without resorting to lithography.

Referring now to FIG. 22, illustrated is a top view 2200 and a cross-sectional view 2202 of the next stage of the example process flow. Following the steps described in connection with FIGS. 8-11 that can relate to the hollow-core metal fill approach, a metal 2 layer (indicated in the legend as 224) can be been deposit filled in the column/cavity 250. The deposit filling can include filling the remaining space in the column/cavity 250 above the transistor 260 with metal 224. Following this step, the solid core scheme can be etched using self-aligned technique described in FIGS. 8-11.

Referring now to FIG. 23, illustrated is a top view 2300 and a cross-sectional view 2302 of the next stage of the example process flow, in which an ALD deposition of high-k2 228 material can be done on top of metal 224. The high-k2 228 deposition can form a thin layer lining the metal 224 and acting as an electric insulator in the capacitor 270. Following the ALD of high-k2 228, a metal 230 filling can be implemented to fill in the empty space remaining in the column/cavity 250. Following this process, a CMP can be completed to polish the top surface of the structure.

Referring now to FIG. 24, illustrated is a top view 2400 and a cross-sectional view 2402 of the next stage of the example process flow. Following the steps explained in connection with description of FIGS. 19-21, the layer of SiGe 218 can be etched out and filled by dielectric 222 using the etching hole 256. The process can then include a CMP to polish to top surface of the structure.

Figure 25:
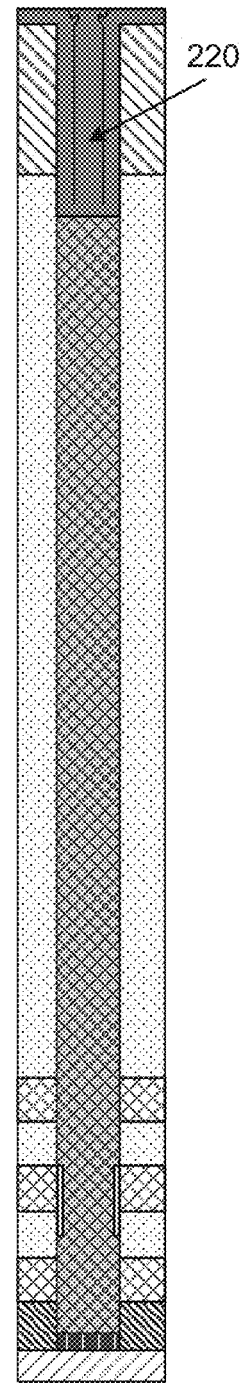
FIGS. 25-27 show top, cross-sectional, and perspective views of an example structure and process flow to form a memory using a solid core doped-silicon-metal capacitor approach, according to an embodiment.
Figure 25:
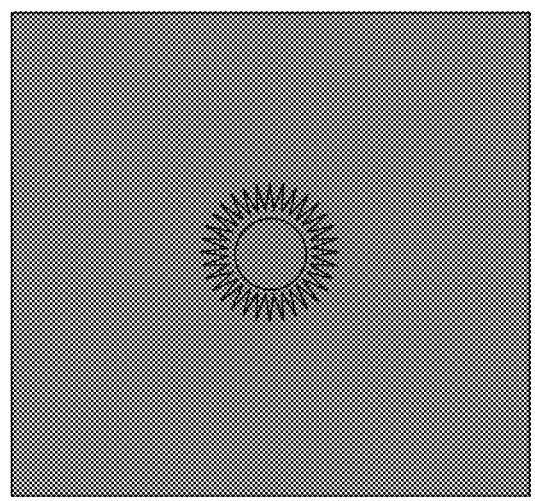
Figure 26:
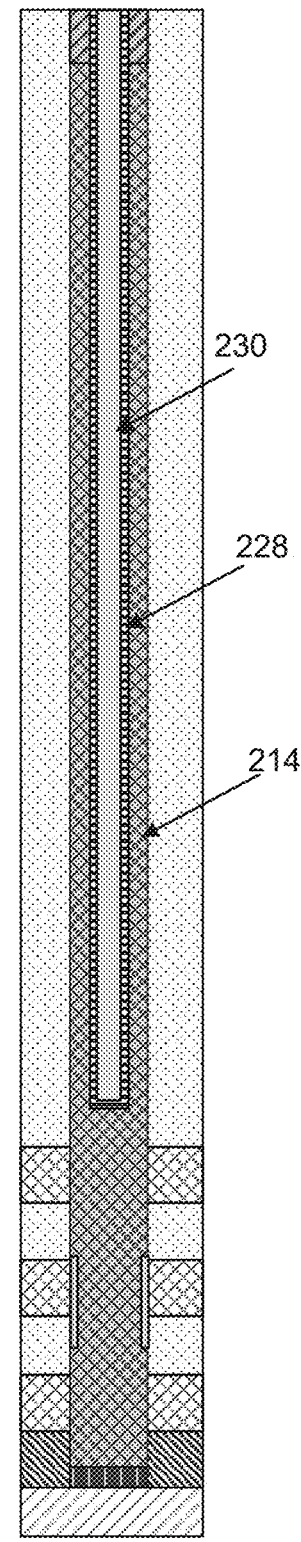
Figure 26:
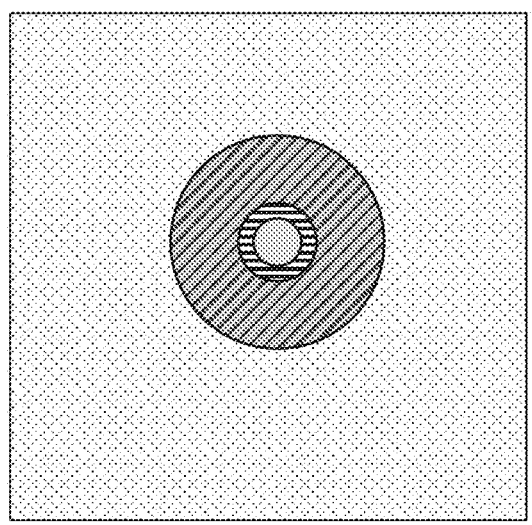
Figure 27:
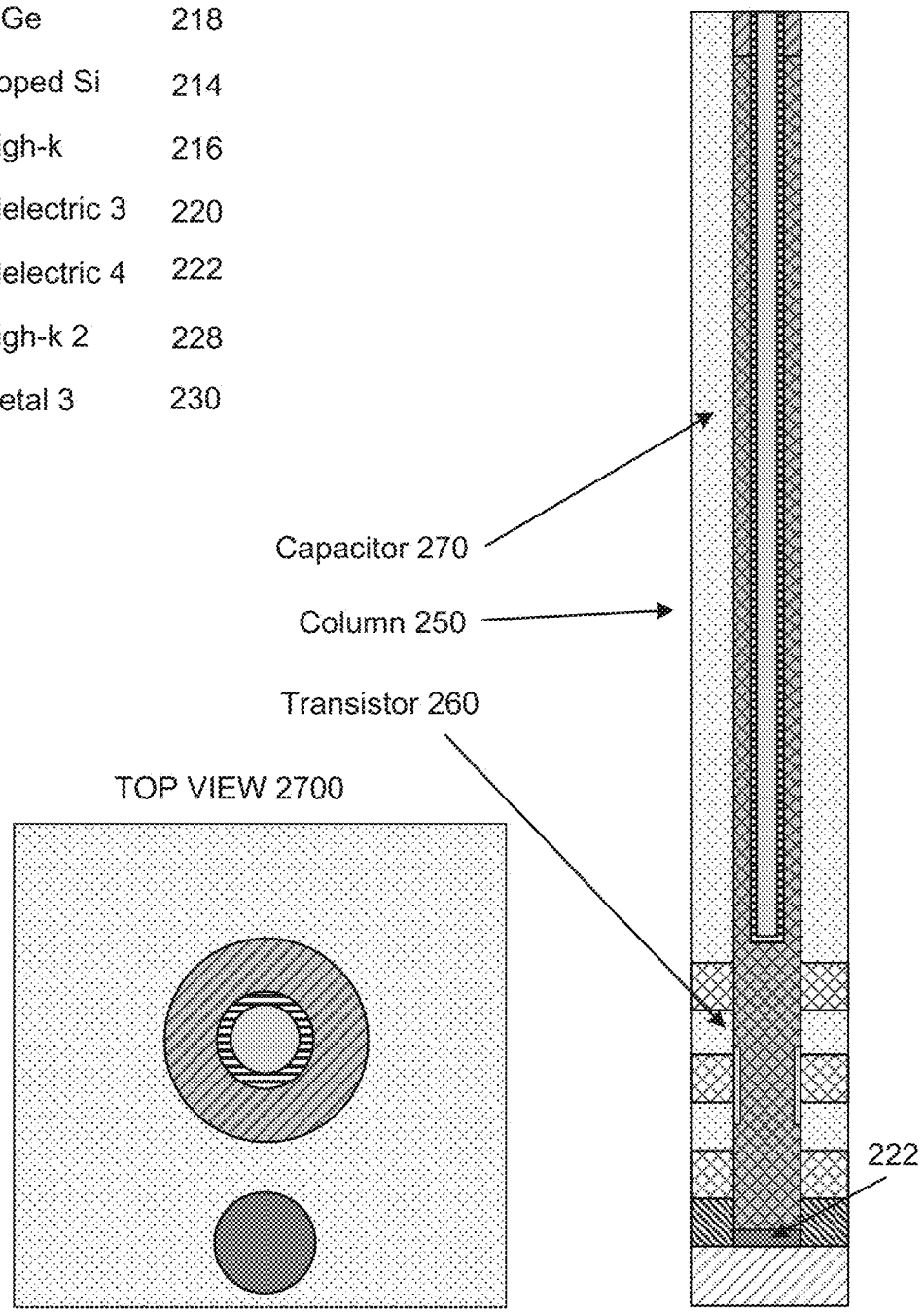

Referring now to FIGS. 25-27, an example of a solid core doped silicon metal capacitor approach for creating a vertically integrated 3D capacitor-based memory cell, is illustrated. This approach can include a scheme that uses doped silicon as one of the two electrically conductive capacitor components. In that sense, the doped silicon can replace one of the metal parts of the capacitor 270.

Referring now to FIG. 25, illustrated is a top view 2500 and a cross-sectional view 2502 of the next stage of the example process flow. Following the procedure as explained in FIG. 13 for solid score scheme, a dielectric 3 (indicated in the legend as 220) can be deposited by ALD for self-aligned core to fabricate capacitor. As with prior similar example in connection with FIG. 14, the ALD deposition of a dielectric layer can create a self-aligned opening through which directional etching downward can be implemented. Also shown in the illustrated structure is that the first dielectric layer above the base layer includes dielectric 6 (indicated in the legend as 232) instead of dielectric 106. Dielectric 232 can be used instead of dielectric 106 for any number of process reasons, including, for example, because dielectric 232 can be resistant to etching process of SiGe 218.

Referring now to FIG. 26, illustrated is a top view 2600 and a cross-sectional view 2602 of the next stage of the example process flow in which directional etching through the opening created by the liner of dielectric 220 can be implemented. The etching can be directional downward etching where the etch cores out a cavity inside of the doped Si 214. The etching of doped Si 214 can include etching close to just above the transistor 260. In some implementations the etching of doped Si 214 can be done until it reaches a distance apart from the top metal 110 layer. The distance where the etching ends above the metal 110 top line can be defined in relation to the size of the transistor 260, such as about, ¼, ⅙, ⅛, 1/10, 1/15, 1/20, 1/30, 1/50 of the length of the transistor 260. The sides of the doped Si 214 can be left intact on the outer walls of the column 250. ALD deposition of high-k2 228 can be completed, followed by filling of the remaining cavity inside of the doped Si 214 with metal 230. Upon deposition of metal 230, metal 230 can form the capacitor with doped Si 214, whereby intervening layer of high-k2 228 serves as an insulator between the two. The process can then be finalized with a CMP to clean and polish the surface.

Referring now to FIG. 27, illustrated is a top view 2700 and a cross-sectional view 2702 of the next stage of the example process flow, in which following the steps as explained in connection with the description of FIGS. 19-21 the SiGe 218 layer beneath the transistor 260 can be etched out and fill in with dielectric 222. With this step, the transistor 260 can be electrically insulated from the base layer 104. This step can be followed by a CMP step.

Figure 28:
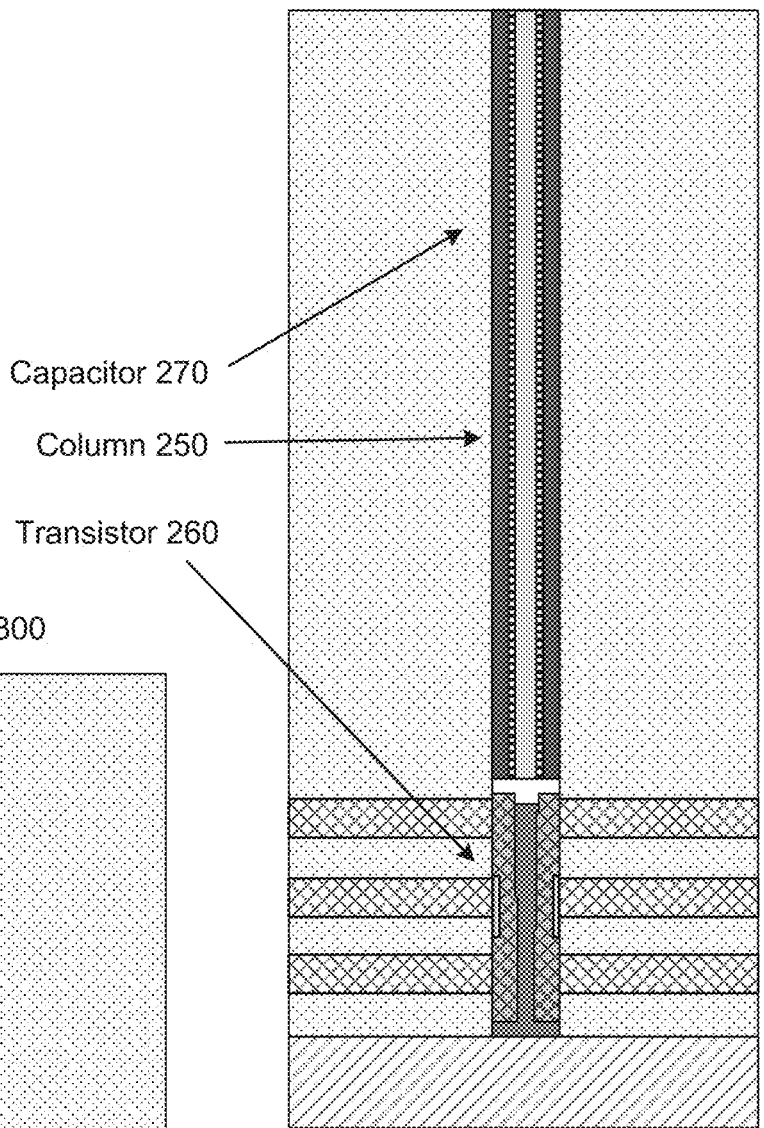
FIG. 28 shows top, cross-sectional, and perspective views of an example structure and process flow to form a memory using a hollow core metal last approach, according to an embodiment.
Figure 28:
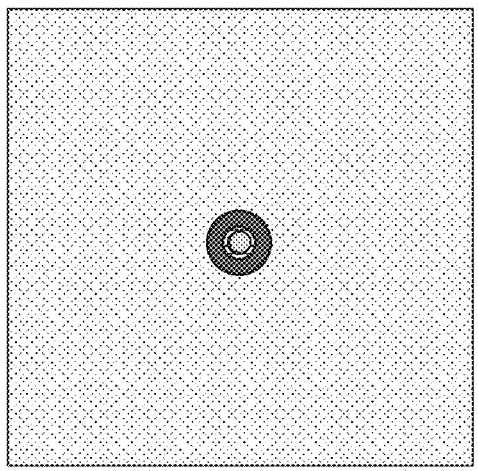

Referring now to FIG. 28, an example of a hollow core metal last approach for creating a vertically integrated 3D capacitor-based memory cell, is illustrated. FIG. 28 includes a top view 2800 and a cross-sectional view 2802 showing the next stage of the process flow, in which similar step to those explained in connection with FIGS. 1-7, 8-12 and 13-16 can be implemented, but in this case the structure can be completed using a metal last scheme. For example, instead of metal 110 used for electrical contacts to the first source/drain, the gate and the second source/drain of the transistor 260, in this case a dielectric 7 (indicated in the legend as 234) can be deposited. Dielectric 234 can include doped and electrically conductive regions or materials to provide electrical contacts to the first source/drain, gate and the second source/drain of the transistor 260.

Figure 29:
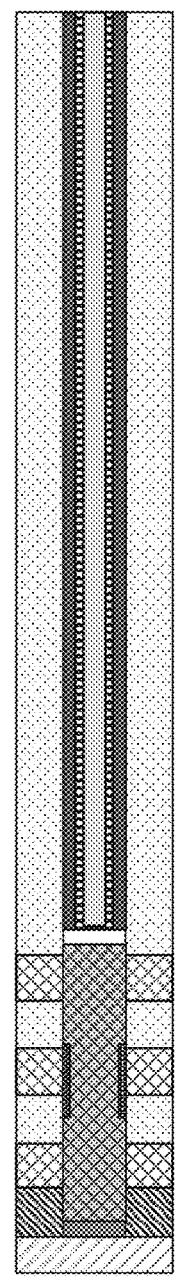
FIG. 29 shows top, cross-sectional, and perspective views of an example structure and process flow to form a memory using a solid core metal last approach, according to an embodiment.
Figure 29:
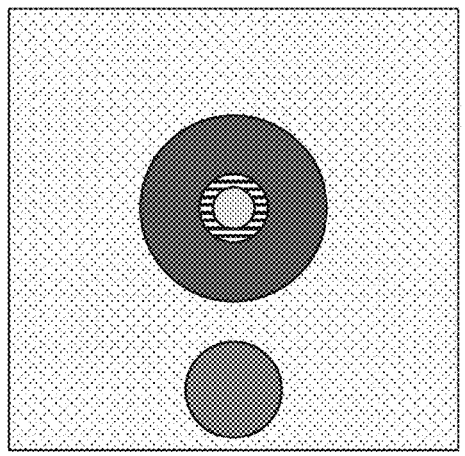

Referring now to FIG. 29, an example of a solid core metal last approach for creating a vertically integrated 3D capacitor-based memory cell, is illustrated. FIG. 29 includes a top view 2900 and a cross-sectional view 2902 of the next stage of the process flow, in which similar steps as described in connection with FIGS. 17-21, 22-24 and 25-27 can be implemented, except this time using the metal last scheme. In this structure instead of metal 110, dielectric 7, indicated as 234, can be deposited instead. This can be applicable to all techniques described in connection with FIGS. 17-21, 22-24 and 25-27.

Figure 30:
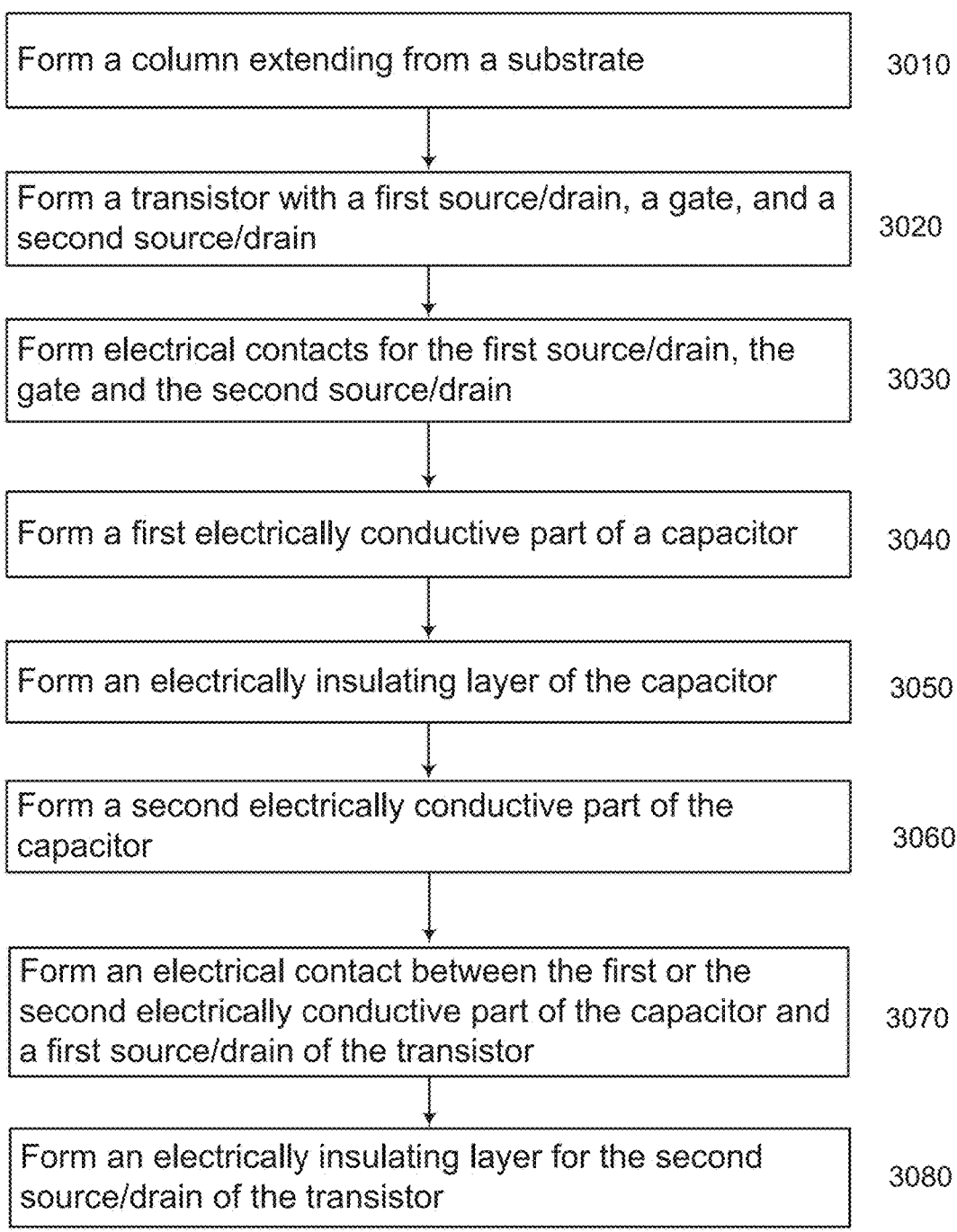
FIG. 30 shows a flow diagrams of example methods for fabricating transistor structures using the process flows described in connection with FIGS. 1-29, according to an embodiment.

Referring now to FIG. 30, a flow diagram of an example method 3000 for fabricating a capacitor-based memory structure is illustrated. In some aspects, the method 3000 relates to fabricating a single-bit vertically oriented DRAM memory cell that can include a vertically oriented capacitor 270 configured that is vertically integrated with a vertically oriented transistor 260.

In a brief overview, method 3000 can include a series of steps from 3010 to 3080. Step 3010 can include forming a cavity or a column 250 extending from a substrate. Step 3020 can include forming a transistor with a first source/drain, a gate and a second source/drain. Step 3030 can include forming electrical contacts for the first source/drain, the gate and the second source/drain. Step 3040 can include forming a first electrically conductive part of a capacitor. Step 3050 can include forming an electrically insulating layer of the capacitor. Step 3060 can include forming a second electrically conductive part of the capacitor. Step 3070 can include forming an electrical contact between the first or the second electrically conductive part of the capacitor and the first source/drain of the transistor. Step 3080 can include forming an electrically insulating layer for the second source/drain of the transistor.

At step 3010, the method can include the steps for forming a cavity or a column. The cavity can be formed to extend from a substrate. The cavity can be shaped as an elongated column or a hole that is vertical to the substrate. The cavity can be formed inside of a dielectric, a substrate or any one or more materials described herein, including for example layers of semiconductor materials, dielectrics, metals and/or epitaxially grown materials. The cavity can be formed using process flow steps that are similar to those described herein above in connection with the above-identified U.S. Patent Application.

The cavity can be formed to have a longer depth than width. From a cross-sectional view of the cavity, the cavity's depth can be referred to herein as cavity's length or height and can be perpendicular to the substrate or to the surface of the material on which it was made. The cavity's inner diameter can be the cavity's width. The cavity can be elongate and narrow with respect to its height/length, so as to have a longer length/height than its width. The cavity's length to width ratio can be such that cavity's length is more than 1, 1.5, 2, 2.5, 3, 3.5, 4, 4.5, 5, 6, 7, 8, 9, 10, 11, 12, 13, 14, 15, 20, 25, 30, 40 or 50 times its width.

The cavity can have a substantially constant cross-section throughout its height/length, the variations in the cross-section being limited by the process tolerances. In some implementations, the cavity can have varying cross-sections across different parts of its height. The cross-section of the cavity can include the shape of, or be shaped as: a circle, an oval, a triangle, a rectangle, a square or any quadrilateral, a pentagon, a hexagon, a heptagon, an octagon, or otherwise a polygon having any number of sides. The cavity can be perpendicular to a substrate on which it is built. The cavity can also be angled at any number of angle ranges, including 1, 2, 3, 4, 5, 7, 10, 15, 20, 25, 35 and 45 degrees from the vertical position. The cavity can be formed by material or materials that surround it and can be filled in to include at least a transistor and/or a capacitor.

Step 3020 can include forming a transistor with a first source/drain, a gate and a second source/drain. The transistor can be formed in a vertical orientation, such as a VFET or any other transistor described herein. The transistor can be formed using process flow steps similar to those described herein above in connection with the above-identified U.S. Patent Application. The transistor can include a doped semiconductor material. The transistor can be elongated and have its length be vertical be aligned or parallel with the length of cavity and larger than its width. Transistor can be vertically oriented with respect to the substrate or the top surface in which the cavity is formed. The transistor length can be vertically and coaxially aligned with the height of the cavity or column in which it can be disposed. The transistor can be located at the lower part of the cavity and that the capacitor can be stacked on top of the transistor in the upper part of the cavity. In some implementations, the capacitor can be located at the lower part of the cavity and the transistor is stacked on top of capacitor in the upper part of the cavity.

Transistor can include material in which it is formed and that can be elongate and fill out the space of the cavity in which it is disposed. The material forming the transistor can include silicon, gallium arsenide, or any other semiconductor. The material can be epitaxially grown in the cavity. Transistor can include a source, a drain and a gate. The source and drain can include doped regions to form a p-n junction therein. The gate can include a layer of dielectric material with a high dielectric factor kappa (high-k). Dielectric material can include any dielectric described herein.

The transistor can be formed in a first portion of the column. The first portion of the column can include a first source/drain structure extending horizontally from the column, a gate structure above the first source/drain structure and extending horizontally from the column and a second source/drain structure above the gate structure and extending horizontally from the column. Each of the first source/drain structure, the gate structure and the second source drain structure can be separated by at least one dielectric. The first portion can also include a semiconductor material extending from the first source/drain structure to the second source/drain structure. The semiconductor material can include a doped semiconductor material, such as a doped silicon.

Step 3030 can include forming electrical contacts for the first source/drain, the gate and the second source/drain. The electrical contacts for the transistor can be formed using process flow steps similar to those described herein above in connection with the above-identified co-pending U.S. Patent Application. In some implementations, the transistor is oriented so as to have its source located above the gate, and the gate being located above the drain. In some implementations, the transistor is oriented to have the drain being located above the gate, and the gate being located above the source. Depending on the implementation the source can be physically the closest contact of the transistor to the capacitor with which the transistor is electrically connected. In some implementations, the drain of the transistor is the physically closest contact of the transistor to the capacitor.

Each one of the source, gate and drain can include electrical contacts. The electrical contacts can include electrically conductive lines or leads for transferring power to and from the source, gate or drain. The electrically conductive lines or leads can include electrically conductive metal material, electrically conductive doped semiconductor material, or any other electrically conductive material. Electrical contacts for the source, gate and drain can be disposed orthogonally to the length of the transistor. Electrical contacts can connect to or integrate with the source Step 3040 can include forming a first electrically conductive part of a capacitor. A first electrically conductive part of a capacitor can include any electrically conductive material, including a metal, a doped semiconductor or any other electrical conductor. A first electrically conductive part of a capacitor can include a layer of material that is disposed in the cavity using an ALD deposition, metal filling or other metal layer applications described herein. For example, a first electrically conductive part of a capacitor can be formed using process flow steps similar to those described herein above in connection with FIG. 4 in which ALD deposition can be used. For example, a first electrically conductive part of a capacitor can be formed using process flow steps similar to those described herein above in connection with FIGS. 8-11, in which metal can be filled and then etched out. For example, a first electrically conductive part of a capacitor can be formed using process flow steps similar to those described herein above in connection with FIGS. 13-15, in which a doped silicon can be epitaxially grown and then etched out. It is understood that any doped semiconductor material can be used instead of the silicon to form the first electrically conductive part of the capacitor.

The first electrically conductive part of the capacitor can be vertically oriented with respect to the substrate. The first electrically conductive part can have its length longer than its width. The first electrically conductive part can have its length oriented along the length of the cavity. The first electrically conductive part can be coaxially aligned with the cavity. The first electrically conductive part can be shaped as an elongate rod that can have any cross-section, including: circular, triangular, quadrilateral, square, rectangular, pentagonal, hexagonal, octagonal or shape of any other polygon. The first electrically conductive part can be shaped as, or include, a flat plate. The first electrically conductive part can be shaped as, or include, a curved plate. The first electrically conductive part can be shaped so as to be vertically disposed down the left side of a cross-section of a cavity, a right side of the cross-section of the cavity and/or down the middle of the cross-section of the cavity.

The first electrically conductive part can include a hollow cavity within the first electrically conductive part. The hollow cavity can be elongate and run along the length of the first electrically conductive part. The hollow cavity can have longer depth than its inner diameter. The hollow cavity can extend in depth any amount with respect to the length of the first electrically conductive part. For example, the first electrically conductive part can have a hollow cavity whose depth is at least 5, 10%, 20%, 30%, 40%, 50%, 60%, 70%, 80%, 90% or 95% of the length of the first electrically conductive part.

The first electrically conductive part can be formed to be in electrical contact with the transistor. In some implementations, the first electrically conductive part can be in electrical contact with a source of a transistor. In some implementations, the first electrically conductive part can be in electrical contact with a drain of a transistor. In some implementations the first electrically conductive part can be in an electrical contact with a ground or an electrical common.

Step 3050 can include forming an electrically insulating layer of the capacitor. The electrically insulating layer can include a dielectric layer, a high-k layer or any other electrically insulating layer or material described herein. The dielectric layer can be formed using ALD techniques. For example, a first electrically conductive part of a capacitor can be formed using process flow steps similar to those described herein above in connection with FIGS. 6, 11, 16, 18, 23 and/or 26. The electrically insulating layer can insulate the first electrically conductive part of the capacitor from the second electrically conductive part of the capacitor.

The electrically insulating layer can form a thin film of material. The thin film can have a thickness of any amount, depending on the electrically insulating and other material properties. For example, the thin film of material can be anywhere between 1-50 nm in thickness. In some implementations, the thin film of electrically insulating layer between the two electrically conductive parts of the capacitor can be at least 1 nm, 2 nm, 3 nm, 5 nm, 7 nm, 10 nm, 12 nm, 15 nm, 17 nm, 20 nm, 25 nm, 30 nm, 40 nm, or 50 nm. In some implementations, the thin film has a thickness of less than 1 nm, such as 0.2, 0.4, 0.6, 0.8, or 0.9 nm. In some implementations it has a thickness of greater than 50 nm.

Step 3060 can include forming a second electrically conductive part of the capacitor. The second electrically conductive part of a capacitor can include any electrically conductive material, including a metal, a doped semiconductor or any other electrical conductor. The second electrically conductive part of a capacitor can include a layer of material that is disposed in the cavity using an ALD deposition, metal filling or other metal layer applications described herein. For example, a second electrically conductive part of a capacitor can be formed using process flow steps similar to those described herein above in connection with FIGS. 7, 12, 16, 18, 23 and 26.

The second electrically conductive part, just like the first electrically conductive part, can include doped semiconductor, such as doped silicon, which can be implemented similar to the steps on growing and etching doped silicon described earlier herein in connection with FIGS. 13-14. It is understood that any doped semiconductor material described herein can be used instead of the silicon to form the second electrically conductive part of the capacitor.

The second electrically conductive part of the capacitor can be vertically oriented (perpendicular) with respect to the substrate. The second electrically conductive part can have its length longer than its width. The second electrically conductive part can have its length oriented along the length of the cavity. The second electrically conductive part can be coaxially aligned with the cavity. The second electrically conductive part can be shaped as an elongate rod that can have any cross-section, including: circular, triangular, quadrilateral, square, rectangular, pentagonal, hexagonal, octagonal or shape of any other polygon. The second electrically conductive part can be shaped as, or include, a flat plate. The second electrically conductive part can be shaped as, or include, a curved plate. The second electrically conductive part can be shaped so as to be vertically disposed down the left side of a cross-section of a cavity, a right side of the cross-section of the cavity and/or down the middle of the cross-section of the cavity.

The second electrically conductive part can be spaced apart from the first electrically conductive part to form capacitance. The first and second electrically conductive parts can form a structure that is equivalent to two capacitive plates. In some implementations the second electrically conductive part is inserted into, or formed so as to be at least partly inside of, the interior cavity of the first electrically conductive part. For example, the second electrically conductive part can have at least 5%, 10%, 20%, 30%, 40%, 50%, 60%, 70%, 80%, 90%, 95%, or up to 100% of its length inserted inside, or formed so as to be at least partly inside, of the cavity of the first electrically conductive part. As described above in connection with step 3050, an electrically insulating layer can be disposed between the first and second electrically conductive parts, and include sufficient thickness so as to prevent an electrical shorting and/or substantially reduce current tunneling between them to the threshold acceptable in the industry. For example, the current tunneling can be reduced so as to enable the capacitor to hold the charge more than 1, 2, 3, 4, 5, 6, 7, 8, 9, 10, 15, 20, or 30 times the time duration of a standard DRAM refresh signal.

The second electrically conductive part can include a hollow cavity. The hollow cavity can be elongate and have longer depth than its inner diameter. The hollow cavity can be elongate and run along the length of the second electrically conductive part. The hollow cavity can have longer depth than its inner diameter. The hollow cavity can extend in depth any amount with respect to the length of the first electrically conductive part. For example, the first electrically conductive part can have a hollow cavity whose depth is at least 10%, 20%, 30%, 40%, 50%, 60%, 70%, 80%, 90% or 95% of the length of the first electrically conductive part. In some implementations the first electrically conductive part is inserted into, or formed so as to be at least partly inside of, the interior cavity of the second electrically conductive part. For example, the first electrically conductive part can have at least 5%, 10%, 20%, 30%, 40%, 50%, 60%, 70%, 80%, 90%, 95% or up to 100% of its length inserted inside, or formed so as to be at least partly inside, of the cavity of the second electrically conductive part.

The second electrically conductive part can be formed to be in electrical contact with the transistor. In some implementations, the second electrically conductive part can be in electrical contact with a source of a transistor. In some implementations, the second electrically conductive part can be in electrical contact with a drain of a transistor. In some implementations the second electrically conductive part can be in an electrical contact with a ground or an electrical common.

The capacitor, including the first electrically conductive part and the second electrically conductive part, can be included into a second portion of the column or cavity 250. The second portion of the column or cavity 250 can be vertically aligned with the first portion of the column or cavity 250 that can include the transistor.

Step 3070 can include forming an electrical contact between the first electrically conductive part of the capacitor and the first source/drain of the transistor. Depending on the configuration, this step can also include forming an electrical contact between the second electrically conductive part of the capacitor and the first source/drain of the transistor.

For example, forming the electrical contact can include forming of a silicide layer between the first electrically conductive part of a capacitor and a source of a transistor. Forming the electrical contact can include forming of a silicide layer between the first electrically conductive part of a capacitor and a drain of a transistor. Forming the electrical contact can include forming of a silicide layer between the second electrically conductive part of a capacitor and a source of a transistor. Forming the electrical contact can include forming of a silicide layer between the second electrically conductive part of a capacitor and a drain of a transistor.

The layer of silicide can be formed by annealing an interface between a semiconductor forming the transistor and a metal, such as a first electrically conductive part of the capacitor or the second electrically conductive part of the capacitor. The layer of silicide can also be formed by depositing two metals, one of which forms silicide with the semiconductor material upon deposition and/or annealing. For example, a first electrically conductive part of a capacitor can be formed using process flow steps similar to those described herein above in connection with, for example, FIGS. 4-5, 8 and 18.

Forming electrical contact can further include providing a continuous doped semiconductor region from the transistor and through the first or the second electrically conductive part of the capacitor. For example, a first electrically conductive part of a capacitor can be formed using process flow steps similar to those described herein above in connection with FIGS. 13-16.

Step 3080 can include forming an electrically insulating layer for the second source/drain of the transistor. Forming the electrically insulating layer for the second source/drain of the transistor, can include removing SiGe layer between the base layer or a substrate and the transistor. In case that another electrically conductive material, such as a doped semiconductor or a metal, is used instead of SiGe, it is understood that the same act of forming the insulating layer can apply to such other material as well. For example, forming an electrically insulating layer can include forming an insulating layer between a source of the transistor and the base layer or the substrate. For example, forming an electrically insulating layer can include forming an insulating layer between a drain of the transistor and the base layer or the substrate. For example, forming an electrically insulating layer can be done using process flow steps similar to those described herein above in connection with FIGS. 2, 14, 19-21, 24, and 27.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features described only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A memory, comprising:
   a first portion including a transistor, the first portion including:
      a first source/drain structure extending horizontally;
      a gate structure above the first source/drain structure and extending horizontally;
      a second source/drain structure above the gate structure and extending horizontally, each of the structures separated from each other by at least one dielectric; and
      a semiconductor material extending from the first source/drain structure to the second source/drain structure;
   a second portion including a capacitor electrically coupled to and extending from the transistor.

2. The memory of claim 1, wherein the capacitor and the transistor are each vertically aligned with the semiconductor material.

3. The memory of claim 1, wherein the semiconductor material extends through the second portion.

4. The memory of claim 1, wherein the first portion is adjacent the substrate, the second portion is adjacent the first portion, and the first portion and the second portion are vertically aligned.

5. The memory of claim 1, wherein the capacitor includes:
   a first metal part having an interior cavity; and
   a second metal part at least partly formed inside of the interior cavity of the first metal part.

6. The memory of claim 5, further comprising a layer of electrically insulating material disposed between the first metal part and the second metal part.

7. The memory of claim 1, further comprising:
   a first metal part of the capacitor in electrical contact with the transistor; and
   a second metal part of the capacitor in electrical contact with an electrical common or a ground.

8. A method of fabricating a memory device including a transistor, the method comprising:
   forming a stack of layers for the transistor including:
      a first source/drain structure of the transistor;
      a gate structure of the transistor, the gate structure being above the first source/drain structure and extending horizontally; and
      a second source/drain structure of the transistor, each of the structures separated from each other by at least one dielectric;
   forming a cavity through the stack of layers;
   forming a semiconductor material in a first portion of the cavity, the semiconductor material extending from the first source/drain structure to the second source/drain structure; and
   forming a capacitor electrically coupled to and extending from the transistor in a second portion of the cavity.

9. The method of claim 8, wherein the capacitor and the transistor are each vertically aligned with the cavity.

10. The method of claim 8, wherein the transistor includes a doped silicon material.

11. The method of claim 8, wherein the semiconductor material extends continuously through the first portion and the second portion of the cavity.

12. The method of claim 8, further comprising:
   forming a first metal part of the capacitor;
   forming an interior cavity in the first metal part; and
   forming a second metal part at least partialy formed inside of the interior cavity of the first metal part.

13. The method of claim 12, further comprising forming a layer of electrically insulating material disposed between the first metal part and the second metal part.

14. The method of claim 8, further comprising:
   forming a first metal part of the capacitor in electrical contract with the transistor; and forming a second metal part of the capacitor in electrical contact with an electrical common or ground.

15. A system comprising:
a column extending from a substrate, the column comprising:
a transistor having a channel extending vertically along the column;
a capacitor substantially vertically aligned with the transistor and having a length that is greater than a width of the capacitor, the capacitor including:
a first metal part in electrical contact with the transistor and defining an interior cavity;
a second metal part at least partly disposed inside of the interior cavity of the first metal part and in an electrical contact with an electrical common or a ground, the first metal part oriented vertically aligned with the transistor; and
a layer of electrically insulating material disposed inside the interior cavity in between the first metal part and the second metal part.

16. The system of claim 15, further comprising a second dielectric material layer electrically insulating a source/drain of the transistor from the substrate.

17. The system of claim 15, further comprising a layer of silicide disposed between a doped region of the transistor and the first metal part.

18. The system of claim 15, further comprising a first metal contact forming a first source/drain of the transistor, a second metal contact forming a gate of the transistor, and a third metal contact forming a second source/drain of the transistor.

19. The system of claim 15, further comprising an electrical contact between a first source/drain region of the transistor and the first metal part of the capacitor.

20. The system of claim 19, further comprising the first source/drain region of the transistor vertically aligned with a second source/drain region of the transistor.

* * * * *